(12) United States Patent
Yip

(10) Patent No.: US 9,589,978 B1
(45) Date of Patent: Mar. 7, 2017

(54) MEMORY DEVICES WITH STAIRS IN A STAIRCASE COUPLED TO TIERS OF MEMORY CELLS AND TO PASS TRANSISTORS DIRECTLY UNDER THE STAIRCASE

(71) Applicant: MICRON TECHNOLOGY, INC., Boise, ID (US)

(72) Inventor: Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/053,291

(22) Filed: Feb. 25, 2016

(51) Int. Cl.
*H01L 27/108* (2006.01)
*H01L 27/115* (2006.01)
*H01L 23/528* (2006.01)

(52) U.S. Cl.
CPC ...... *H01L 27/11573* (2013.01); *H01L 23/528* (2013.01); *H01L 27/11526* (2013.01); *H01L 27/11556* (2013.01); *H01L 27/11582* (2013.01)

(58) Field of Classification Search
CPC ......... H01L 27/11524; H01L 27/11529; H01L 27/1157; H01L 27/11273; H01L 27/2454; H01L 27/1153; H01L 29/66833; H01L 29/792
USPC ............... 257/296, 314, 324, 260, 261, 300; 438/137, 138, 156, 192, 216, 266, 287
See application file for complete search history.

(56) References Cited

U.S. PATENT DOCUMENTS

2015/0001613 A1* 1/2015 Yip ....................... H01L 27/115
257/329

* cited by examiner

*Primary Examiner* — Jarrett Stark
*Assistant Examiner* — Shahed Ahmed
(74) *Attorney, Agent, or Firm* — Dicke, Billig & Czaja, PLLC

(57) ABSTRACT

In an example, a memory device includes a staircase comprising a flight of stairs and a plurality of pass transistors directly under the staircase. The stairs of the flight of stairs are respectively coupled to different tiers of memory cells, and a different pass transistor of the plurality of pass transistors is coupled to each of the stairs of the flight of stairs.

26 Claims, 12 Drawing Sheets

MEMORY DEVICES WITH STAIRS IN A STAIRCASE COUPLED TO TIERS OF MEMORY CELLS AND TO PASS TRANSISTORS DIRECTLY UNDER THE STAIRCASE

FIELD

The present disclosure relates generally to, memory devices, and, in particular, the present disclosure relates to memory devices with stairs in a staircase coupled to tiers of memory cells and to pass transistors directly under the staircase.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density (e.g., the number of memory cells in a given area of an integrated circuit die). One way to increase the density of memory devices is to form stacked memory arrays, e.g., often referred to as three-dimensional memory arrays.

The memory cells at a common location (e.g., at a common vertical level) in a stacked memory array, for example, may form a tier of memory cells. The memory cells in each tier might be coupled to one or more access lines, such as local access lines (e.g., local word lines), that are in turn selectively coupled to drivers by transistors, such as pass transistors. In some examples, the memory cells in each tier might be commonly coupled to a common assess line that might be referred to as an access plate.

Each access plate commonly coupled to a respective tier of memory cells may be coupled to a pass transistor by a routing line. For example, the pass transistors and routing lines coupled to the respective access plates might be under the stacked memory array. However, as the number of tiers, and thus the number of access plates, increases so does the number of pass transistors and routing lines. For example, the number of pass transistors and routing lines might increase until there is not enough room under stacked memory array to accommodate all of the pass transistors and routing lines, at which point the size of the stacked memory array might need to be increased to accommodate the extra pass transistors and routing lines thereunder.

For the reasons stated above, and for other reasons stated below which will become apparent to those skilled in the art upon reading and understanding the present specification, there is a need in the art for alternatives to existing pass transistor and/or routing circuitry configurations in memory devices with stacked memory arrays.

DETAILED DESCRIPTION

Figure 1A:
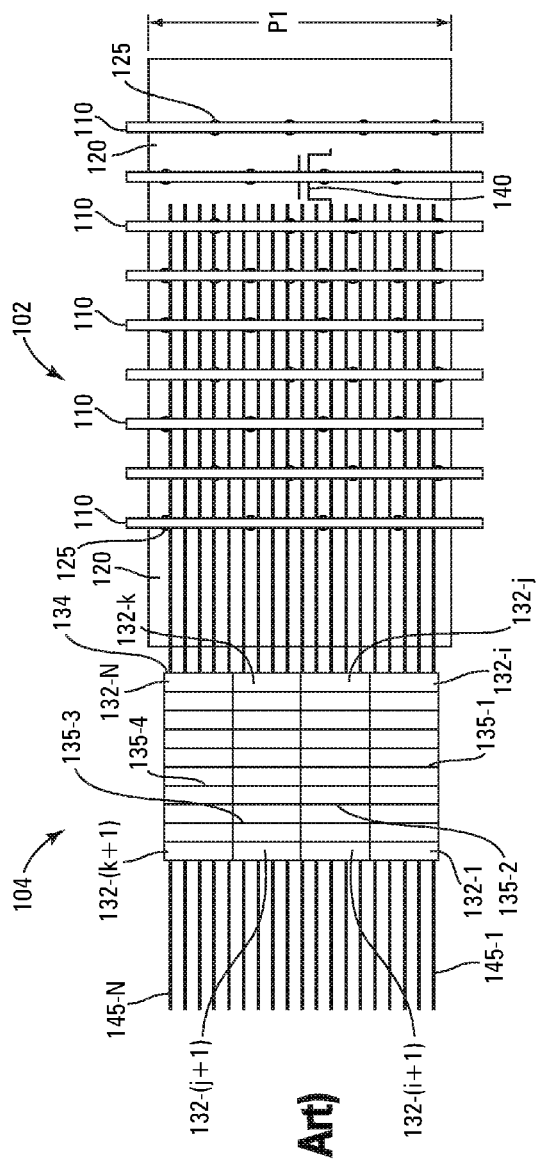
FIG. 1A is a top-down view of an example of staircase in a memory device that includes a stacked memory array, according to background art.

In the following detailed description, reference is made to the accompanying drawings that form a part hereof, and in which is shown, by way of illustration, specific examples. In the drawings, like numerals describe substantially similar components throughout the several views. Other examples may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1A is a top-down view of an example of a portion of a memory device that includes a stacked (e.g., three-dimensional) memory array, according to background art. For example, the memory array might include a block 102 of memory cells, e.g., that may be erased concurrently, and a periphery 104. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

Figure 1B:
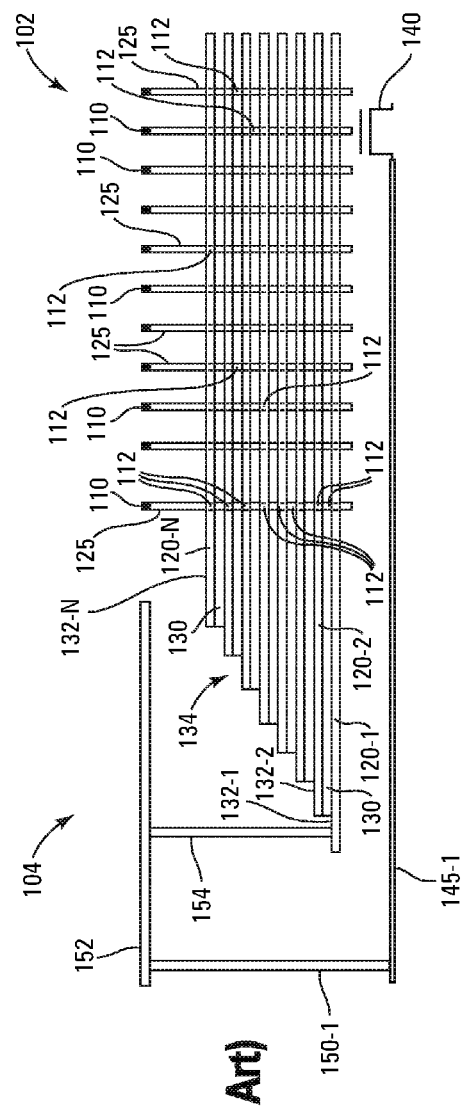
FIG. 1B is an elevation view of an example of a portion of staircase in a memory device that includes a stacked memory array, according to background art.
Figure 1C:
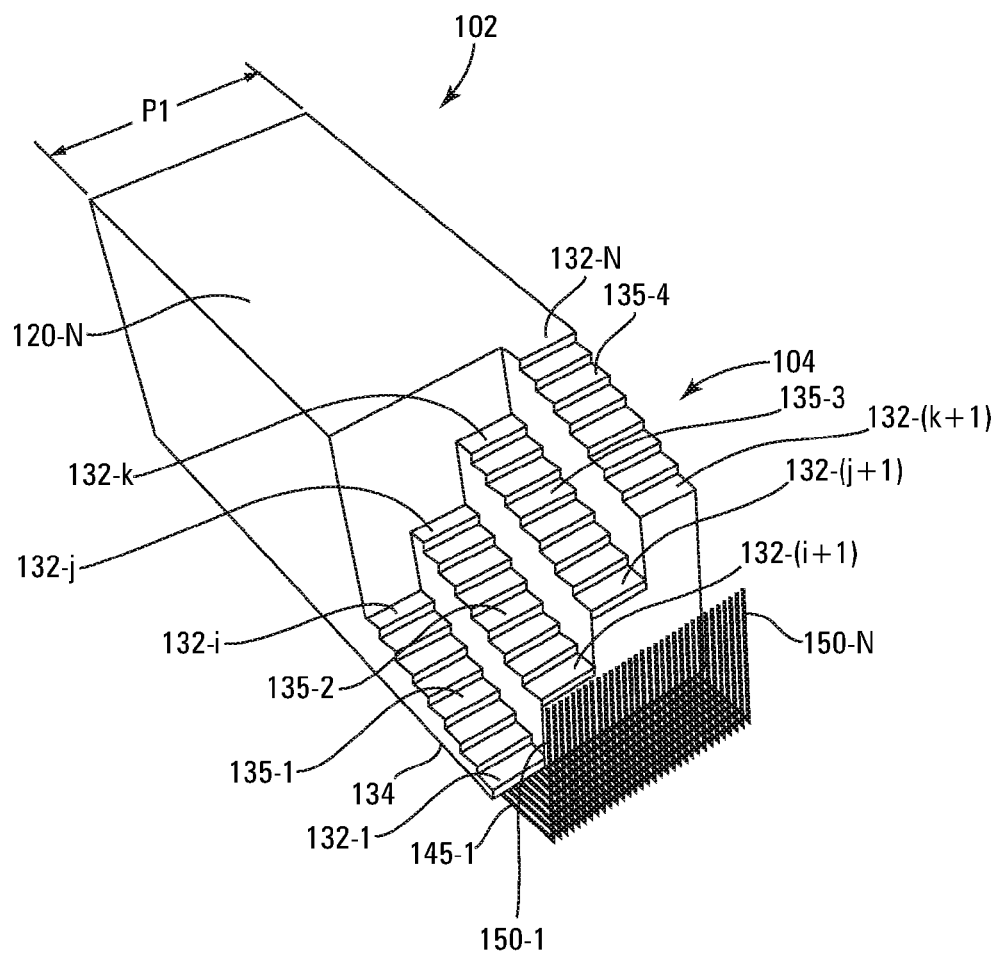
FIG. 1C is a top perspective view of an example of a staircase of a memory device, according to background art.
Figure 1D:
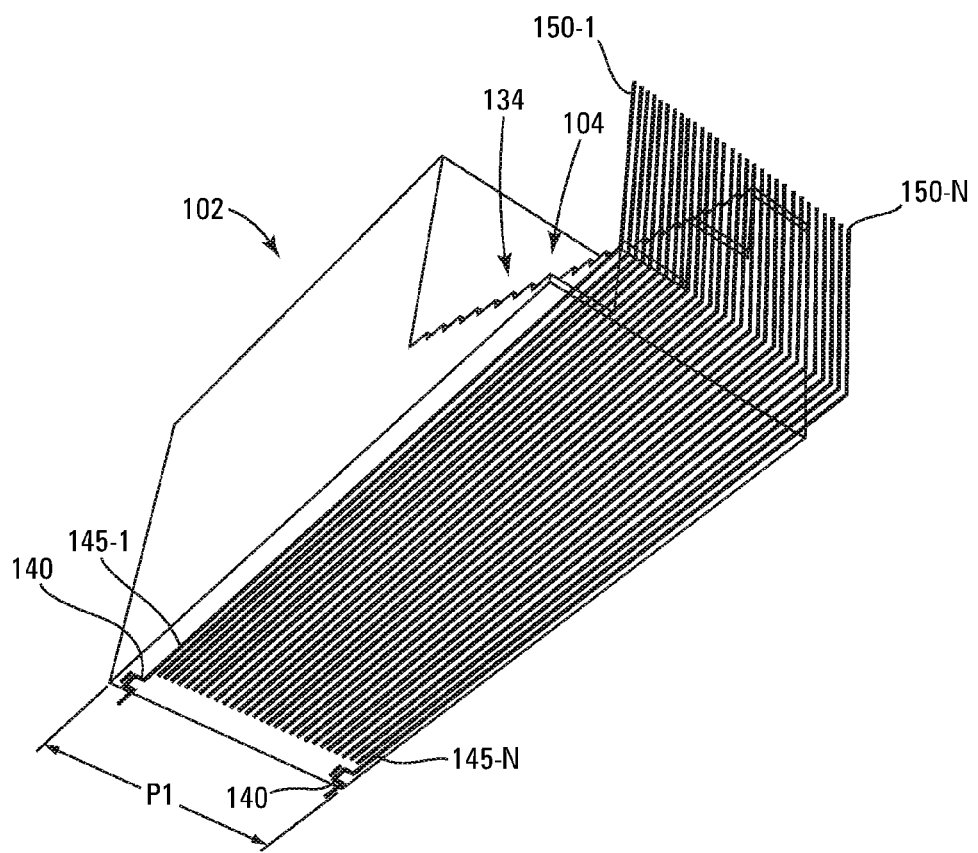
FIG. 1D is a bottom perspective view of an example showing pass transistors under a stacked memory array, according to background art.

FIG. 1B is an elevation view of an example of a portion of a memory device, e.g., taken along a direction of data lines 110, e.g., bit lines, in FIG. 1A, according to background art. FIG. 1C is a top perspective view of an example of a portion of a memory device, according to background art. FIG. 1D is a bottom perspective view of an example of a portion of a memory device, according to background art.

Block 102 may include a plurality of tiers of memory cells 112 (FIG. 1B), where the tiers of memory cells 112 are respectively a different levels, e.g., vertical levels. The term "vertical" may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

The memory cells 112 in each tier may be at a common vertical level and may be commonly coupled to an access plate 120, such as a word-line plate, at that common vertical level. For example, the memory cells 112 in respective ones of the tiers respectively at the different levels may be respectively commonly coupled to respective ones of access plates 120-1 to 120-N. An access plate 120 might include a planar conductor to which the memory cells 112 in a corresponding tier are commonly coupled. Alternatively, an access plate 120 might refer to a plurality of shorted-together access lines (e.g., word lines), where respective portions (e.g., groupings) of the memory cells 112 in a corresponding tier are commonly coupled to respective ones of the shorted-together access lines.

The memory cells 112 in a tier may be located at intersections of the access plate 120 for that tier and a plurality of structures (e.g., vertical structures) 125. Each structure 125 might include a vertical semiconductor (e.g., forming a core of the respective structure 125), such as a pillar, and a charge-storage structure adjacent to (e.g., on) the semiconductor. Note that an access plate 120 may be coupled to or include a control gate of a memory cell 112 at each intersection of that access plate 120 and a structure 125.

In some examples, the semiconductor might include silicon that might be conductively doped to have a p-type conductivity or an n-type conductivity, and the charge-storage structure might include a charge trap or a floating gate. Other structures capable of indicating a data state through changes in threshold voltage might also be used.

A plurality of access plates 120 intersecting a structure 125 at different vertical levels might define a vertical string of series-coupled memory cells 112. That is, for example, the memory cells 112 in a string may respectively be at the vertical levels of the access plates 120. For example, a string of series-coupled memory cells 112 might include one memory cell from each tier coupled to one of the access plates 120 corresponding to that tier. A string of memory cells 112 might be selectively coupled to a data line 110, e.g., by a select transistor, such as a drain select transistor (not shown), that is coupled to an end of the string of memory cells 112 and to the data line 110. The string of memory cells 112 might also be selectively coupled to a source (not shown), e.g., by a select transistor, such as a source select transistor (not shown), that is coupled to an opposite end of the string of memory cells 112 and to the source. The number of access plates 120 may be equal to the number of memory cells in a string of series-coupled memory cells 112, for example.

The access plates 120 might be electrically isolated and separated from each other, for example. That is, for example, a dielectric 130, such as oxide and/or nitride, might be between the access plates 120, as shown in FIG. 1B.

Access plates 120-1 to 120-N may respectively extend into periphery 104 by different distances, as shown in FIG. 1B. For example, the distance by which an access plate 120 extends into periphery 104 may decrease as the vertical level of the access plate 120 increases. For example, the distances by which access plates 120-1 to 120-N extend into periphery 104 may respectively decrease.

A portion of an access plate that extends beyond an end of the access plate at the next vertical level defines a step 132, e.g., a landing pad for a contact. For example, the portion of access plate 120-1 that extends beyond the end of access plate 120-2 defines a step 132-1. Each access plate 120, for example, may have a portion (e.g., an extension) that forms (e.g., corresponds to) a step (e.g., a stair) 132. For example, the steps 132-1 to 132-N shown in FIGS. 1A, 1B, and 1C may respectively be portions of access plates 120-1 to 120-N. For example, a staircase 134 may include the steps 132-1 to 132-N, and periphery 104 may include staircase 134.

As shown in FIGS. 1A and 1C, steps (e.g., stairs) 132-1 to 132-$i$ may form a group 135-1 of the steps 132-1 to 132-$i$, such as a flight of stairs 132-1 to 132-$i$; steps 132-($i$+1) to 132-$j$ may form a group 135-2 of the steps 132-($i$+1) to 132-$j$, such as a flight of stairs 132-($i$+1) to 132-$j$; steps 132-($j$+1) to 132-$k$ may form a group 135-3 of the steps 132-($j$+1) to 132-$k$, such as a flight of stairs 132-($j$+1) to 132-$k$; and steps 132-($k$+1) to 132-N may form a group 135-4 of the steps 132-($k$+1) to 132-N, such as a flight of stairs 132-($k$+1) to 132-N. For example, the groups 135-1 to 135-4 may be distributed, e.g., side by side, across a pitch P1 of block 102, as shown in FIGS. 1A and 1C, where the pitch P1 (e.g., the block pitch P1) is a distance across the block in the direction of the data lines 110, as shown in FIG. 1A.

Since the number of access plates 120 may be equal to the number of memory cells 112 in a string of series-coupled memory cells 112, as the number of memory cells 112 in a string of series-coupled memory cells 112 increases, the number of steps may increase accordingly. However, the block pitch P1 may be insufficient to accommodate the increased number of steps, e.g., in the side-by-side arrangement shown in FIG. 1C. Therefore, for example, the block pitch P1, and thus the size of block 102, might need to be increased. Such an increase, could cause the size of the access plates 120 to increase, e.g., causing the capacitance of access plates 120 to increase. This could result in increased power requirements for driving the access plates 120 that could impede performance of the memory device.

Each of the steps 132, and thus each of the access plates 120, may be coupled to a pass transistor 140 by a routing line 145, where representative pass transistors 140 are shown in FIGS. 1A, 1B, and 1D. For example, respective ones of the steps 132, and thus respective ones of the access plates 120, may be respectively coupled to respective ones of a plurality pass transistors 140 by respective ones of a plurality routing lines 145. For example, respective ones of the routing lines 145-1 to 145-N may be respectively coupled to respective ones of the access plates 120-1 to 120-N at respective ones of the steps 132-1 to 132-N. Respective ones of the routing lines 145-1 to 145-N may be respectively coupled to respective ones of the plurality pass transistors 140.

Routing lines 145-1 to 145-N may extend in a direction that is transverse (e.g., perpendicular) to the direction of data lines 110, as shown in FIG. 1A. It should be recognized the term perpendicular takes into account variations from "exactly" perpendicular due to routine manufacturing and/or assembly variations and that one of ordinary skill in the art would know what is meant by the term perpendicular.

A routing line 145, such as the routing line 145-1, may be coupled to a respective one of the steps 132-1 to 132-N, such as step 132-1, and thus a respective one of the access plates 120-1 to 120-N, such as access plate 120-1, by a vertical contact 150-1, a connector 152, and a contact 154, as shown in FIG. 1B. For example, contact 150-1 may be coupled to access plate 120-1 and to connector 152 that may be at the same vertical level as the data lines 110. That is, for example, contact 150-1 may extend (e.g., vertically) between routing line 145-1 and connector 152. Connector 152 may be coupled to contact 154 that may extend (e.g., vertically) between connector 152 and step 132-1. Contact 154 may be coupled to step 132-1. Vertical contacts 150-1 to 150-N may be respectively coupled to routing lines 145-1 to 145-N, as shown in FIG. 1D.

Connector 152 may extend in a direction that is perpendicular to the direction of data lines 110, as is apparent from FIG. 1B that shows that connector 152 is parallel to routing line 145-1. It should be recognized the term parallel takes into account variations from "exactly" parallel due to routine manufacturing and/or assembly variations and that one of ordinary skill in the art would know what is meant by the term parallel.

The pass transistors 140 may be coupled to drivers, such as access-line drivers, e.g., word-line drivers, (not shown). That is, for example, each pass transistor 140 may be configured to selectively couple a driver to an access plate 120, and thus the tier of memory cells 112 commonly coupled to that access plate 120.

The routing lines 145-1 to 145-N may be under the memory block 102, and thus the memory array, as shown in FIG. 1D. For example, routing lines 145-1 to 145-N may be distributed across the block pitch P1 of block 102, as shown in FIGS. 1A and 1D. That is, for example, routing lines 145-1 to 145-N may be distributed across block 102 in a direction of the data lines 110. Routing lines 145-1 to 145-N may extend in a direction that is perpendicular to the direction of data lines 110, as shown in FIG. 1A. Vertical contacts 150-1 to 150-N may be distributed across the block pitch P1 in a direction of the data lines 110, for example. As shown in FIGS. 1C and 1D.

A pass transistor 140 may be coupled to the end of each of the routing lines 145-1 to 145-N as shown for representative pass transistors in FIGS. 1A, 1B, and 1D. The pass transistors 140 may also be under the memory block 102, and thus the memory array, as shown in FIGS. 1B and 1D. For example, pass transistors 140 may be distributed across the pitch P1 of block 102, e.g., across block 102 in the direction of the data lines 110.

Since the number of access plates 120 may be equal to the number of memory cells 112 in a string of series-coupled memory cells 112, the number of routing lines 145, the number of vertical contacts 150, and the number of pass transistors 140 may be equal to the number of memory cells 112 in a string of series-coupled memory cells 112, for example. Therefore, as the number of memory cells 112 in a string of series-coupled memory cells 112 increases, the number of routing lines 145, the number of vertical contacts 150, and the number of pass transistors 140 that are distributed across the block pitch P1 may increase proportionally. However, the block pitch P1 may be insufficient to accommodate the increased number of routing lines 145, vertical contacts 150, and pass transistors 140, and the block pitch P1, and thus the size of block 102, might need to be increased.

Figure 2A:
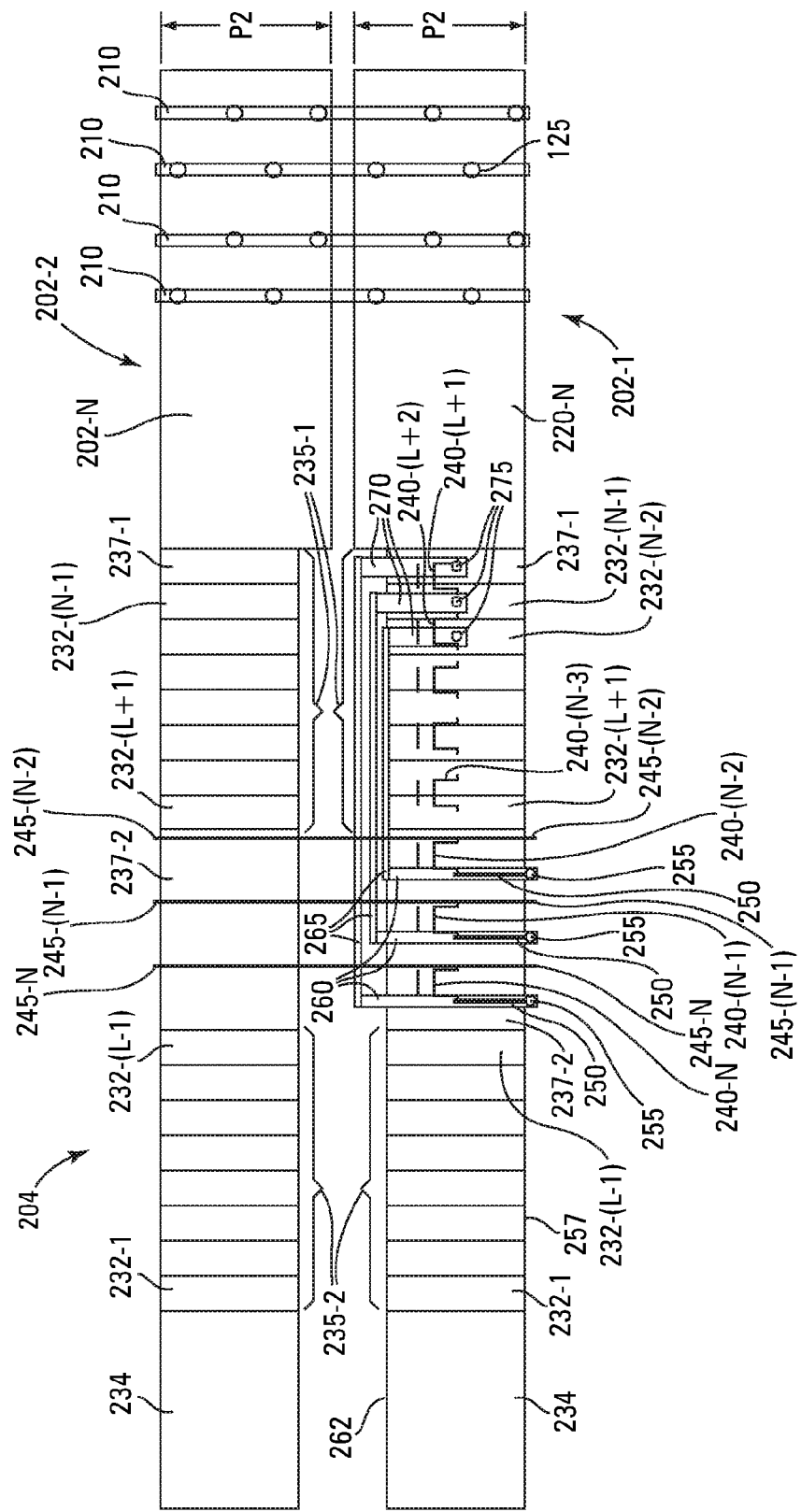
FIG. 2A is a top-down view of an example of staircases in a memory device that includes a stacked memory array.
Figure 2B:
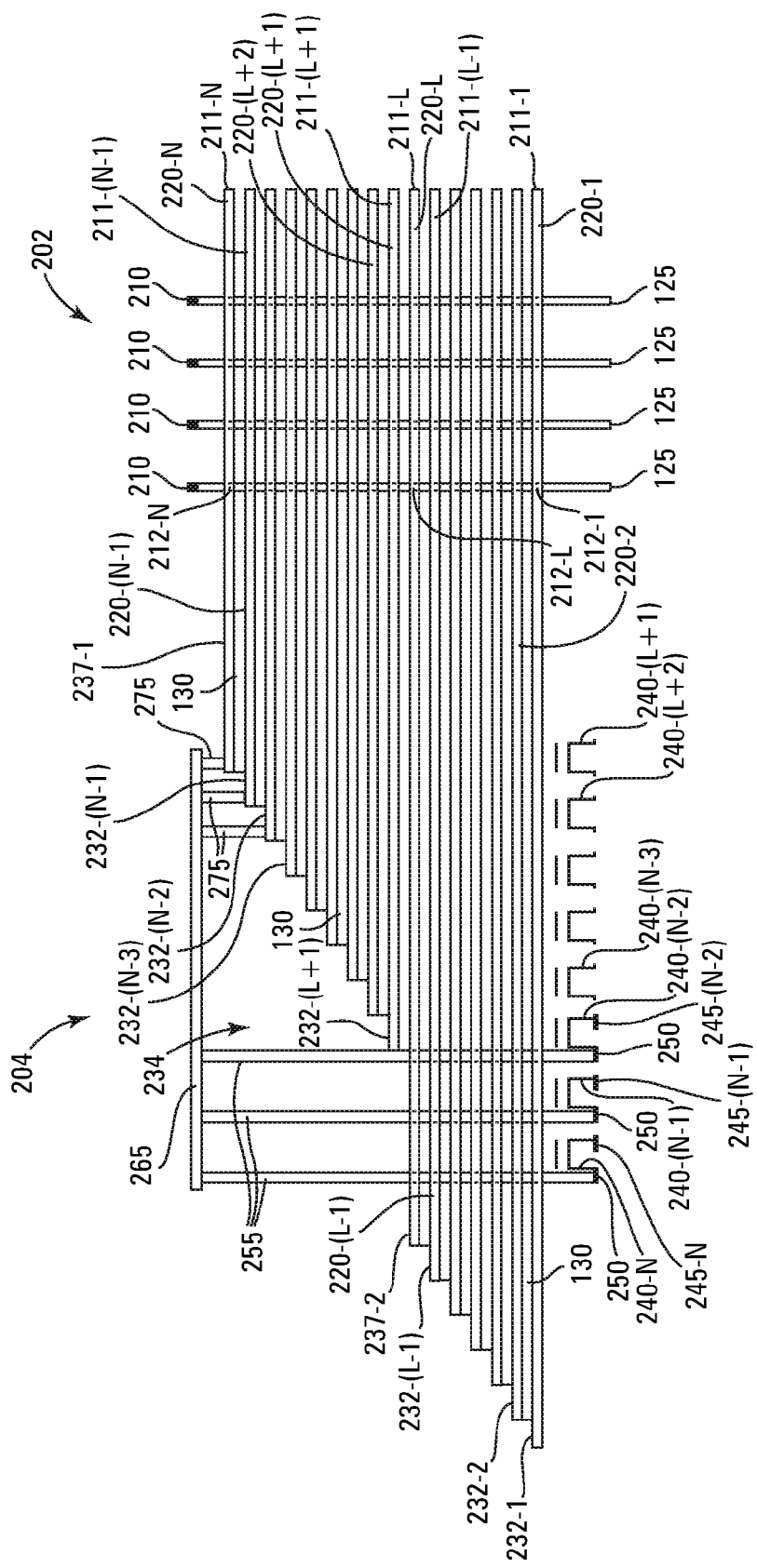
FIG. 2B is an elevation view of an example of staircases in a memory device that includes a stacked memory array.

FIG. 2A is a top-down view of an example of a portion of a memory device that includes a stacked (e.g., three-dimensional) memory array. For example, the memory array might include a block (e.g., a memory block) 202-1 of memory cells, e.g., that may be erased concurrently, a block (e.g., a memory block) 202-2 of memory cells, e.g., that may be erased concurrently, and a periphery 204. Blocks 201-2 and 201-2 might be mirror images of each other, for example. FIG. 2B is an elevation view of an example of a portion of a memory device taken along a direction of the data lines 210, e.g., bit lines, in FIG. 2A.

FIG. 2B illustrates a representative block 202 of memory cells that may include block 202-1 or block 202-2, for example. Block 202 may include a plurality of tiers 211 (e.g., tiers 211-1 to 211-N) of memory cells 212 (FIG. 2B), such as non-volatile memory cells, where tiers 211-1 to 211-N are respectively at different levels, e.g., vertical levels. The memory cells 212 in a respective one of the tiers 211-1 to 211-N may be at a common vertical level and may be commonly coupled to a respective access plate 220, such as a word-line plate, at that common vertical level.

For example, the memory cells 212 in respective ones of the tiers 211-1 to 211-N respectively at the different levels may be respectively commonly coupled to respective ones of access plates 220-1 to 220-N. An access plate 220 might include a planar conductor to which the memory cells 212 in a corresponding tier are commonly coupled. Alternatively, an access plate 220 might refer to a plurality of shorted-together access lines (e.g., word lines), where respective portions (e.g., groupings) of the memory cells 212 in a corresponding tier 211 are commonly coupled to respective ones of the shorted-together access lines.

Figure 2C:
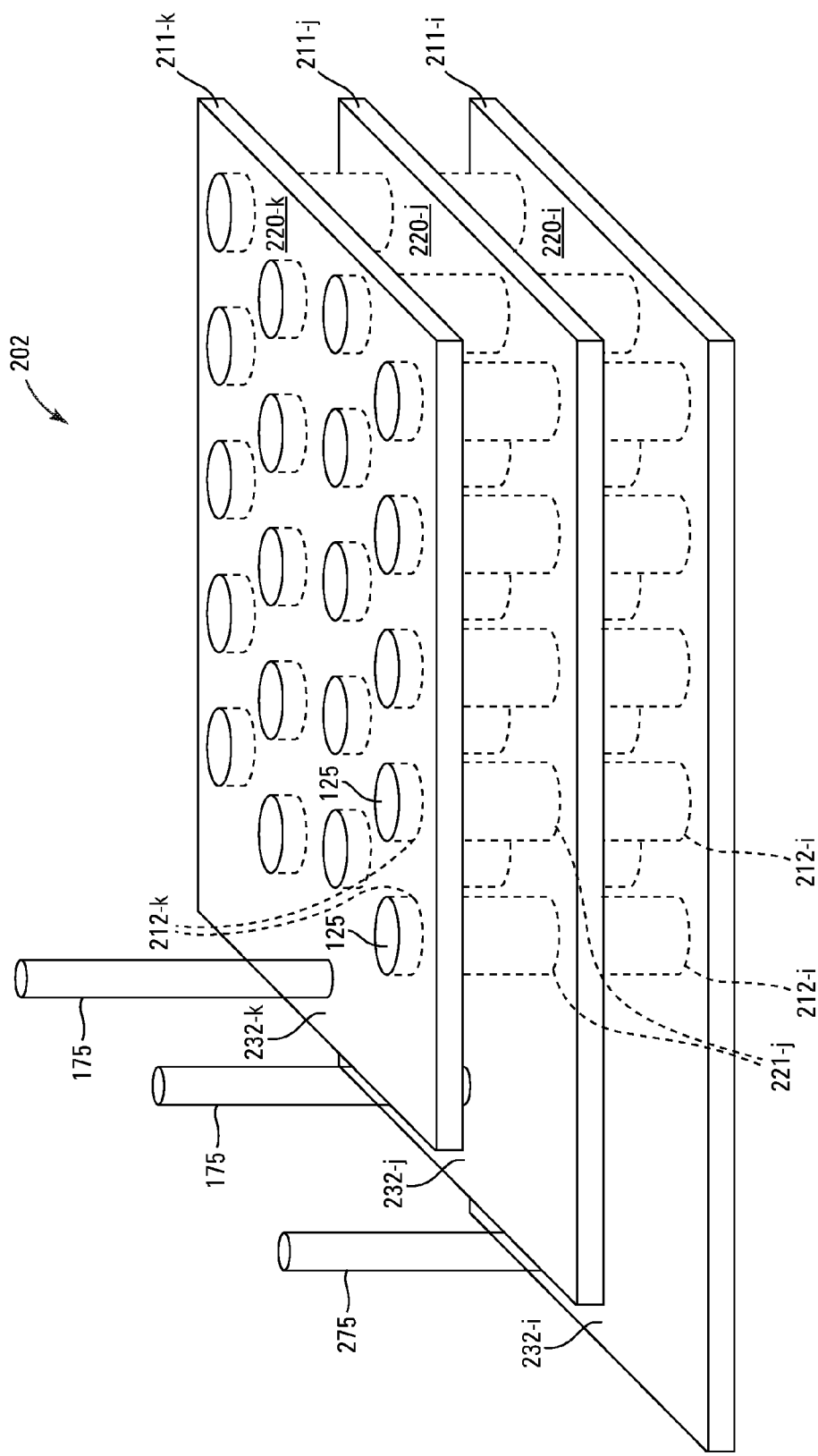
FIG. 2C is perspective view of an example of a portion of a stacked memory block.

FIG. 2C is a perspective view of an example of a portion of a stacked memory block, such as a portion of the representative memory block 202 in FIG. 2B. FIG. 2C shows tiers 211-*i* to 211-*k* of the tiers 211-1 to 211-N. The memory cells 212-*i* in tier 211-*i* may be commonly coupled to access plate 220-*i*; the memory cells 212-*j* in tier 211-*j* may be commonly coupled to access plate 220-*j*; and memory cells 212-*k* in tier 211-*k* may be commonly coupled to access plate 220-*k*.

The memory cells 212 in a tier 211 may be located at intersections of the access plate 220 for that tier 211 and the plurality of structures 125. Note that an access plate 220 may be coupled to or include a control gate of a memory cell 212 at each intersection of that access plate 220 and a structure 125. For example, as shown in FIG. 2C, the memory cells 212-*i* in tier 211-*i* may be located at the intersections of access plate 220-*i* and the structures 125; the memory cells 212-*j* in tier 211-*j* may be located at the intersections of access plate 220-*j* and the structures 125; and the memory cells 212-*k* in tier 211-*k* may be located at the intersections of access plate 220-*k* and the structures 125.

A plurality of access plates 220 intersecting a structure 125 at different vertical levels (FIG. 2B) might define a string (e.g., vertical string), such as a NAND string, of series-coupled memory cells 212. That is, for example, the memory cells 212-1 to 212-N in a string may respectively be at the vertical levels of the access plates 220-1 to 220-N. For example, a string of series-coupled memory cells 212 might include one memory cell 212 from each tier 211 coupled to one of the access plates 220 corresponding to that tier 211. For example, the memory cells 212-1 to 212-N in a string might be respectively in tiers 211-1 to 211-N. That is, for example, a number of the access plates 220 may be equal to the number of memory cells in a string of series-coupled memory cells 212.

In FIG. 2C, the access plates 220-*i* to 220-*k* intersecting a structure 125 might define a portion of a string of series-coupled memory cells. For example, the memory cells 212-*i*, 212-*j*, and 212-*k* respectively at the intersections of access plates 220-*i* to 220-*k* and a structure 125 may be coupled in series and may form a portion of a string of series-coupled memory cells 212-1 to 212-N. Note that the access plates 220-*i* to 220-*k* and thus the memory cells 212-*i*, 212-*j*, and 212-*k* may wrap (e.g., completely) around a structure 125, as shown in FIG. 2C.

Figure 2D:
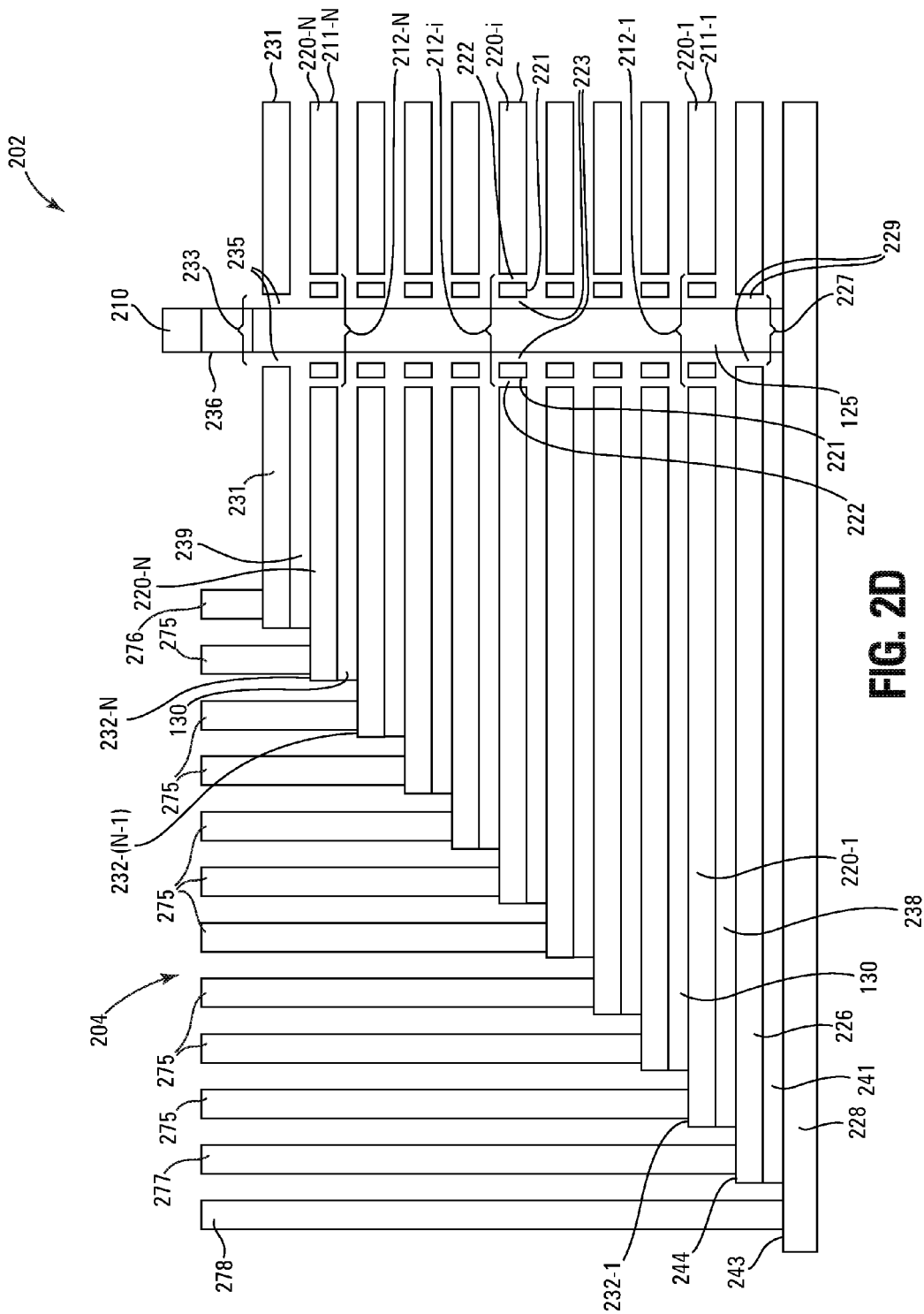
FIG. 2D is a cross-sectional elevation view of an example of a portion of a stacked memory block and a staircase.

FIG. 2D is a cross-sectional elevation view of an example of a portion of a stacked memory block, such as a portion of the representative memory block 202 in FIG. 2B, illustrating additional detail of the memory cells 212-1 to 212-N. Each of memory cells 212-1 to 212-N may include a control gate, e.g., that might be a portion of or coupled to a respective access plate 220. For example, in FIG. 2D, access plates 220-1 to 220-N may respectively include the control gates of memory cells 212-1 to 212-N so that the control gates of memory cells 212-1 to 212-N may be respectively represented by access plates 220-1 to 220-N.

Each of memory cells 212-1 to 212-N may include a charge-storage structure 221, such as a charge trap or a floating gate, e.g., at the intersection of structure 125 and a respective access plate 220. Each of memory cells 212-1 to 212-N may include a dielectric 222, such as a blocking dielectric, that may be between a respective access plate 220 and a respective charge-storage structure 221. For example, a dielectric 222 of memory cell 212-*i* may be between access plate 220-*i* and the charge-storage structure 221 of memory cell 212-*i*. Each of memory cells 212-1 to 212-N may include a dielectric 223, such as a tunnel dielectric, that may be between a respective charge-storage structure 221 and a structure 125. For example, a dielectric 223 of memory cell 212-*i* may be between the charge-storage structure 221 of memory cell 212-*i* and structure 125. Dielectric 222, charge-storage structure 221, and dielectric 223 may wrap completely around structure 125, for example, and may be at the intersection of an access plate of the access plates 220-1 to 220-N and a structure 125.

A select plate 226, such as a source-select plate, might be located at a vertical level that is below the lowermost tier 211-1 of memory cells and the lowermost access plate 220-1. For example, select plate 226 might be between access plate 220-1 and a source 228 that is at a vertical level below select plate 226 and that may be in contact (e.g., direct physical contact) with an end of structure 125.

A select transistor 227, such as a source select transistor, may be at an intersection of select plate 226 and structure 125 and may be coupled to source 228. For example, select plate 226 may intersect each of the structures 125 in FIG. 2B, and there may be a select transistor 227 at each intersection, so that the select transistors 227 are commonly coupled to select plate 226. A select transistor 227 may include a control gate that is coupled to or that is a portion of select plate 226. For example, in FIG. 2D, the control gate of select transistor 227 may be included in select plate 226. A dielectric 229, such as a gate dielectric, of a select transistor 227 may be between select plate 226 and a structure 125. A select plate 226, and thus a dielectric 229 and a select transistor 227, may wrap completely around a structure 125, for example.

A select plate 231, such as a drain select plate, might be located at a vertical level that is above the uppermost tier 211-N of memory cells and the uppermost access plate 220-N. For example, select plate 231 might be between access plate 220-N and a data line 210 that is at a vertical level above select plate 231.

A select transistor 233, such as a drain select transistor, may be at an intersection of select plate 231 and structure 125. For example, select plate 231 may intersect each of the structures 125 in FIG. 2B, and there may be a select transistor 233 at each intersection, so that the select transistors 233 are commonly coupled to select plate 231. A select transistor 233 may include a control gate that is coupled to or that is a portion of select plate 231. For example, in FIG. 2D, the control gate of select transistor 233 may be included in select plate 231. A dielectric 235, such as a gate dielectric, of select transistor 233 may be between select plate 231 and structure 125. A select plate 231, and thus a dielectric 235 and a select transistor 233, may wrap completely around structure 125, for example. A data line 210 may be coupled to an end of structure 125, and thus to select transistor 233, by a contact 236, for example.

The memory cells 212-1 to 212-N form a string of series-coupled memory cells 212-1 to 212-N. An end of the string of series-coupled memory cells 212-1 to 212-N may be coupled in series to select transistor 227, and an opposite end of the string of series-coupled memory cells 212-1 to 212-N may be coupled in series to select transistor 233. Select transistor 233 may be configured to selectively couple the string of series-coupled memory cells 212-1 to 212-N to data line 210, and select transistor 227 may be configured to selectively couple the string of series-coupled memory cells 212-1 to 212-N to source 228.

The access plates 220 might be electrically isolated and separated from each other, for example. That is, for example, dielectric 130 might be between the access plates 220, as shown in FIGS. 2B and 2D. A dielectric 238 might be between access plate 220-1 and select plate 226; a dielectric 239 might be between access plate 220-N and select plate 231; and a dielectric 241 might be between select plate 226 and source 228.

Access plates 220-1 to 220-N may respectively extend into periphery 204 by different distances, as shown in FIGS. 2B and 2D. The distance by which an access plate 220 extends into periphery 204 (e.g., in a direction that is perpendicular to data lines 210) may decrease as the vertical level of the access plate 220 increases. For example, the distances by which access plates 220-1 to 220-N extend into periphery 204 respectively decrease.

A portion of an access plate 220 that extends beyond an end of the access plate at the next vertical level (e.g., the next higher access plate) may define a step (e.g., a stair) 232, e.g., a landing pad for a contact. For example, in the example of FIG. 2B, the portions of access plates 220-1 to 220-(L−1) that respectively extend beyond the ends of access plates 220-2 to 220-L respectively define steps 232-1 to 232-(L−1), e.g., that are respectively at the vertical levels of tiers 211-1 to 211-(L−1), and the portions of access plates 220-(L+1) to 220-(N−1) that respectively extend beyond the ends of access plates 220-(L+2) to 220-N respectively define steps 232-(L+1) to 232-(N−1), e.g., that are respectively at the vertical levels of tiers 211-(L+1) to 211-(N−1). Note that the portions of the access plates 220-i and 220-j that respectively extend beyond the ends of access plates 220-j and 220-k may respectively define steps 232-i and 232-j in FIG. 2C. The step 232-k may be defined by the portion of access plate 220-k extends beyond an access plate (not shown in FIG. 2C) immediately above access plate 220-k, for example.

In the examples of FIGS. 2a and 2B, a staircase 234 may include the steps 232-1 to 232-(L−1) and the steps 232-(L+1) to 232-(N−1), and periphery 204 may include a staircase 234, e.g., that may sometimes be called a stadium. Staircase 234 may extend in a direction perpendicular to data lines 210 away from a memory block 202 of memory cells.

Staircase 234 may include groups of the steps, such as flights of steps (e.g., stairs) 232. For example, as shown in FIG. 2A, steps 232-(L+1) to 232-(N−1) may form a group 235-1 of the steps 232-(L+1) to 232-(N−1), such as a flight, e.g., a flight of stairs 232-(L+1) to 232-(N−1), and steps 232-1 to 232-(L−1) may form a group 235-2 of the steps 232-1 to 232-(L−1), such as a flight, e.g., a flight of stairs 232-1 to 232-(L−1). For example, the steps 232-1 to 232-(L−1) of group 235-2 respectively correspond to (e.g., are respectively for) tiers 211-1 to 211-(L−1), and the steps 232-(L+1) to 232-(N−1) of group 235-1 respectively correspond to tiers 211-(L+1) to 211-(N−1).

In some examples, the number of steps in group 235-1 may or may not be the same as the number of steps in group 235-2. In some examples, a group (e.g., a flight) might include only one step. For example, a group might include one or more steps.

The portion of access plate 220-L that extends beyond access plate 220-(L+1) may form a landing 237-2 (e.g., sometimes called a crest) of staircase 234 between the group 235-2 of the steps 232-1 to 232-(L−1) and the group 235-1 of the steps 232-(L+1) to 232-(N−1), as shown in FIGS. 2A and 2B. For example, landing 237-2 may serve as a landing pad for a contact. Note that landing 237-2 corresponds to (e.g., is at the vertical level of) tier 211-L. A portion of access plate 220-N may form a landing 237-1 (FIGS. 2A and 2B) that corresponds to (e.g., is at the vertical level of) tier 211-N and may serve as a landing pad for a contact.

A step may extend beyond the steps and/or landings at levels above it in a direction that is perpendicular to data lines 210 in the example of FIG. 2B. For example, step 232-1 extends beyond steps 232-2 to 232-(L−1), landing 237-2, steps 232-(L+1) to 232-(N−1), and landing 237-1 in a direction that is perpendicular to data lines 210. Landing 237-2, for example, extends beyond steps 232-(L+1) to 232-(N−1) and landing 237-1 in a direction that is perpendicular to data lines 210.

Note that the example of FIG. 2D shows that the access plates 220-1 to 220-N might form a single group (e.g., flight) of steps. For example, respective ones of the access plates 220-1 to 220-N may respectively define respective ones of the steps 232-1 to 232-N with no landings. For example, respective ones of the steps 232-1 to 232-N in FIG. 2D are respectively coupled to respective ones of tiers 211-1 to 211-N of memory cells. In the example of FIG. 2D, a portion of source 228 extends beyond select plate 226 to form a step 243; a portion select plate 226 extends beyond access plate 232-1 to form a step 244 that is coupled to select transistor 227; and a portion of access plate 220-N extends beyond select plate 231 to form the step 232-N.

A plurality of pass transistors 240 may be located (e.g., only) under (e.g., directly vertically under) the staircase 234, as shown in FIG. 2B. For example, respective ones of the plurality of transistors 240 may be respectively coupled to respective ones of the steps 232 and landings 237, and thus respective ones of the of access plates 220, and may be respectively coupled to respective ones of a plurality of global access lines (e.g., global word lines), such as the global access lines 245 exemplified in FIGS. 2A and 2B. As such, for example, the respective ones of the plurality of transistors 240 may be configured to respectively selectively couple the respective ones of a plurality of global access lines 245 to the respective ones of the steps 232 and landings 237.

In some examples, the plurality of pass transistors 240 may include a plurality of groups of pass transistors, where respective ones of at least some of the pass transistors 240 in a group may be respectively coupled respective ones of the steps of a group of the steps. For example, as exemplified in FIGS. 2A and 2B, respective ones of the pass transistors 240-(N−2) and 240-(N−1) of the group of pass transistors 240-(L+1) to 240-N may be respectively coupled to respective ones of steps 232-(N−2) and 232-(N−1). Moreover, pass transistor 240-N may be coupled to landing 237-1. Although not shown, respective ones of the pass transistors 240-(L+1) to 240-(N−3) of the group of pass transistors 240-(L+1) to 240-N may be respectively coupled to respective ones of steps 232-(L+1) to 232-(N−3).

Respective ones of the steps 232-1 to 232-(L−1) may be respectively coupled to respective ones of a plurality of pass transistors (not shown in FIG. 2B) under (e.g., directly vertically under) staircase 234, where the respective ones of those pass transistors may be respectively coupled to respective ones of a plurality of global access lines (not shown). Moreover, landing 237-2 might be coupled to a pass transistor (not shown in FIG. 2B) that may be coupled to a global access line (not shown in FIG. 2B) and that may be under (e.g., directly vertically under) staircase 234.

At least some of the group of pass transistors 240-(L+1) to 240-N may be in a region below staircase 234 that is directly vertically below the landing 237-2 that is between the consecutive groups 235-1 and 235-2 of steps. That is, for example, as exemplified in FIG. 2B, pass transistors 240-(N−1) and 240-N may be under staircase 234 in a region that is between the consecutive groups 235-1 and 235-2 of steps and that is directly vertically below landing 237-2.

As exemplified in FIG. 2A, pass transistors 240-(N−2) to 240-N may be below (e.g., directly vertically below) the landing 237-2. As exemplified in FIGS. 2A and 2B, pass transistors 240-(L+2) to 240-(N+3) may be below (e.g., directly vertically below) the group 235-1 of steps 232-(L+1) to 232-(N−1), and pass transistor 240-(L+1) might be under (e.g., directly vertically below) landing 237-1. In some examples, the pass transistors 240-(L+1) to 240-N may be distributed (e.g., aligned) along a direction that is perpendicular to data lines 210, and thus in a direction that is parallel to the direction which the steps and/or landings extend beyond steps and/or landings above them.

The pass transistors 240-(N−2) and 240-(N−1) shown in the examples of FIGS. 2A and 2B may be configured to respectively selectively couple global access lines 245-(N−2) and 245-(N−1) to steps 232-(N−2) and 232-(N−1), and pass transistor 240-N may be configured to selectively couple global access line 232-N to landing 237-1.

In the examples of FIGS. 2A and 2B, respective ones of pass transistors 240-(N−2) to 240-N (e.g., that may be directly vertically under landing 237-2 in the example of FIG. 2A) may be respectively coupled respective ones of lines 250. The respective ones of lines 250 may pass under staircase 234 (e.g., in a direction parallel to data lines 210) respectively from the respective ones of pass transistors 240-(N−2) to 240-N to past a sidewall 257 of staircase 234 that extends from block 202-1 in a direction perpendicular to data lines 210. For example, lines 250 may extend to a location on the outside of sidewall 257, and thus on the outside of staircase 234.

Respective ones of lines 250 may be respectively coupled to (e.g., by direct contact with) respective ones of vertical contacts 255 (e.g., that may be referred to as deep contacts). Contacts 255, for example, might be located on the outside of and adjacent to sidewall 257, as shown in FIG. 2A. Contacts 255 may be distributed (e.g., aligned) along a direction that is perpendicular to the data lines 210. For example, contacts 255 may be distributed along the length of sidewall 257 in a direction parallel to sidewall 257, and thus in a direction perpendicular to the data lines 210. That is, for example, contacts 255 may be aligned with a line that is perpendicular to the data lines 210. For example, contacts 255 may be distributed (e.g., aligned) along a direction that is parallel to the direction which the steps and/or landings extend beyond steps and/or landings above them.

The respective ones of vertical contacts 255 may extend vertically upward from the respective ones of the lines 250 respectively to respective ones of lines 260, e.g., that might be at the vertical level of data lines 210. The respective ones of vertical contacts 255 may be respectively coupled to (e.g., by direct contact with) the respective ones of the lines 260.

In FIG. 2A, the respective ones of lines 260 may extend over landing 237-2 (e.g., in a direction parallel to data lines 210) respectively from the respective ones of vertical contacts 255 and past a sidewall 262 of staircase 234, e.g., that is opposite and parallel to sidewall 257 and that extends from block 202-1 in a direction perpendicular to data lines 210. For example, lines 260 might extend to a location that is outside of sidewall 262, and thus of staircase 234. Note that the opposing sidewalls 257 and 262 may include opposing sidewalls of the access plates 220 and the opposing sidewalls of the dielectric 130 between the access plates 220, for example.

In FIG. 2A, the respective ones of lines 260 may, for example, respectively extend to respective ones of lines 265 and may be respectively coupled to (e.g., by direct contact with) the respective ones of lines 265, e.g., where lines 265 might be at the vertical level of data lines 210. Lines 265 might be located outside of sidewall 262.

The respective ones of the lines 265 might respectively extend from the respective ones of lines 260 in a direction parallel to sidewall 262 and perpendicular to data lines 210 respectively to respective ones of lines 270, in FIG. 2A. The respective ones of the lines 265 might be respectively coupled to (e.g., by direct contact with) respective ones of lines 270, e.g., that might be at the vertical level of data lines 210.

The respective ones of lines 270 may respectively extend from respective ones of lines 265 respectively over at least a portion of respective ones of step 232-(N−2), step 232-(N−1), and landing 237-1 (e.g., in a direction parallel to data lines 210) respectively to respective ones of vertical contacts 275, as shown in FIG. 2A. The respective ones of lines 270 may be respectively coupled to (e.g., by direct contact with) the respective ones of vertical contacts 275. The respective ones of the vertical contacts 275 may respectively extend vertically downward from the respective ones of lines 270 respectively to and may be respectively coupled to (e.g., by direct contact with) the respective ones of step 232-(N−2), step 232-(N−1), and landing 237-1, as shown in FIG. 2B. In the example of FIG. 2C, a vertical contact 275 may be coupled to (e.g., by direct contact with) each of steps 232-*i* to 232-*j*. Each vertical contact 275, and thus each of the steps 232-*i* to 232-*j*, may be coupled to a pass transistor 240.

In some examples, a plurality of vertical contacts 275 might be coupled between and to a respective line 270 and a respective step 232 and/or between and to a respective line 270 and a respective landing 237. This may reduce resistance compared to coupling a single contact 275 between and to a respective line 270 and a respective step 232 and/or between and to a respective line 270 and a respective landing 237 and can provide redundancy. Respective pluralities of vertical contacts 275 may extend vertically downward from the respective ones of lines 270 respectively to and may be respectively coupled to (e.g., by direct contact with) the respective ones of step 232-(N−2), step 232-(N−1), and landing 237-1, for example, as shown in FIG. 2B.

Respective ones of the steps 232-1 to 232-(L−1) may be respectively coupled to respective ones of a plurality of pass transistors (not shown in FIGS. 2A and 2B) under (e.g., directly vertically under) staircase 234, where the respective ones of those pass transistors may be respectively coupled to respective ones of a plurality of global access lines (not shown in FIGS. 2A and 2B). For example, the respective ones of the steps 232-1 to 232-(L−1) might be respectively coupled to respective ones of a plurality of vertical contacts that may be respectively coupled to the respective ones of the plurality of pass transistors. Moreover, landing 237-2 might be coupled to a pass transistor (not shown in FIGS. 2A and 2B) that may be coupled to a global access line (not shown in FIGS. 2A and 2B) and that may be under (e.g., directly vertically under) staircase 234. For example, landing 237-2 might be coupled to a vertical contact that is coupled the pass transistor. The vertical contacts coupled to the respective ones of the steps 232-1 to 232-(L−1) and the landing 237-2 may be distributed (e.g., aligned) along a direction that is perpendicular to the data lines 210, and thus may be distributed (e.g., aligned) along a direction that is parallel to the direction which the steps and/or landings extend beyond steps and/or landings above them. For example, those vertical contacts may be outside of sidewall 257 and may be distributed along the length of sidewall 257 in the direction parallel to sidewall 257.

Group 235-1 of the steps 232-(L+1) to 232-(N−1) and group 235-2 of the steps 232-1 to 232-(L−1) may be in tandem. That is, for example, group 235-1 may be between group 235-2 and a block 202. For example, group 235-2 may be after a group 235-1 in a direction that is away from block 202-1, that is perpendicular to data lines 210, and that is parallel to the direction which the steps and/or landings extend beyond steps and/or landings above them.

The steps 232-1 to 232-(L−1), the steps 232-(L+1) to 232-(N−1), and landings 237-1 and 237-2 may span the entire distance (e.g., that is a direction parallel to data lines 210) between the sidewalls 257 and 262 of a staircase 234, which distance, for example, may be less than or equal to a block pitch P2 (FIG. 2A) of memory array 202-1, where the block pitch P2 is a distance across block 202-1 in the direction of the data lines 110. Note, for example, that contacts 255 may be distributed along a distance that is perpendicular to block pitch P2, and thus along a distance that is parallel to a direction that a step and/or a landing extends beyond the steps or a landing above it.

In some examples, a plurality of pass transistors 240 might be coupled to a step 232 and/or a landing 237. For example, a plurality of pass transistors 240 might be coupled to each step 232 and to each landing 237. In an example, a plurality of transistors 240-(N−2) and a plurality of transistors 240-(N−1) might be respectively coupled to respective ones of steps 232-(N−2) and 232-(N−1), and a plurality of transistors 240-N might be coupled to landing 237-1. Respective pluralities of the pass transistors 240-(L+1) to 240-(N−3) may be respectively coupled to respective ones of steps 232-(L+1) to 232-(N−3), for example.

For some examples, a plurality of pass transistors 240 coupled to a single step 232 or a single landing 237 might be coupled to a single global access line. For example, the plurality of transistors 240-(N−2) coupled to step 232-(N−2) might be coupled to global access line 245-(N−2); the plurality of transistors 240-(N−1) coupled to step 232-(N−1) might be coupled to global access line 245-(N−1); and the plurality of transistors 240-N coupled to landing 237-1 might be coupled to global access line 245-N.

For other examples, respective ones of the plurality of pass transistors 240 coupled to a single step 232 or single landing 237 might be respectively coupled to different global access lines. For example, there might be a plurality of different global access lines 245-(N−2), a plurality of different global access lines 245-(N−1), and a plurality of different global access lines 245-N. For example, respective ones of the plurality of transistors 240-(N−2) coupled to step 232-(N−2) might be respectively coupled to respective ones of the plurality of different global access lines 245-(N−2); respective ones of the plurality of transistors 240-(N−1) coupled to step 232-(N−1) might be respectively coupled to respective ones of the plurality of different global access lines 245-(N−1); and respective ones of the plurality of transistors 240-N coupled to landing 237-1 might be respectively coupled to respective ones of the plurality of different global access lines 245-N.

Figure 2E:
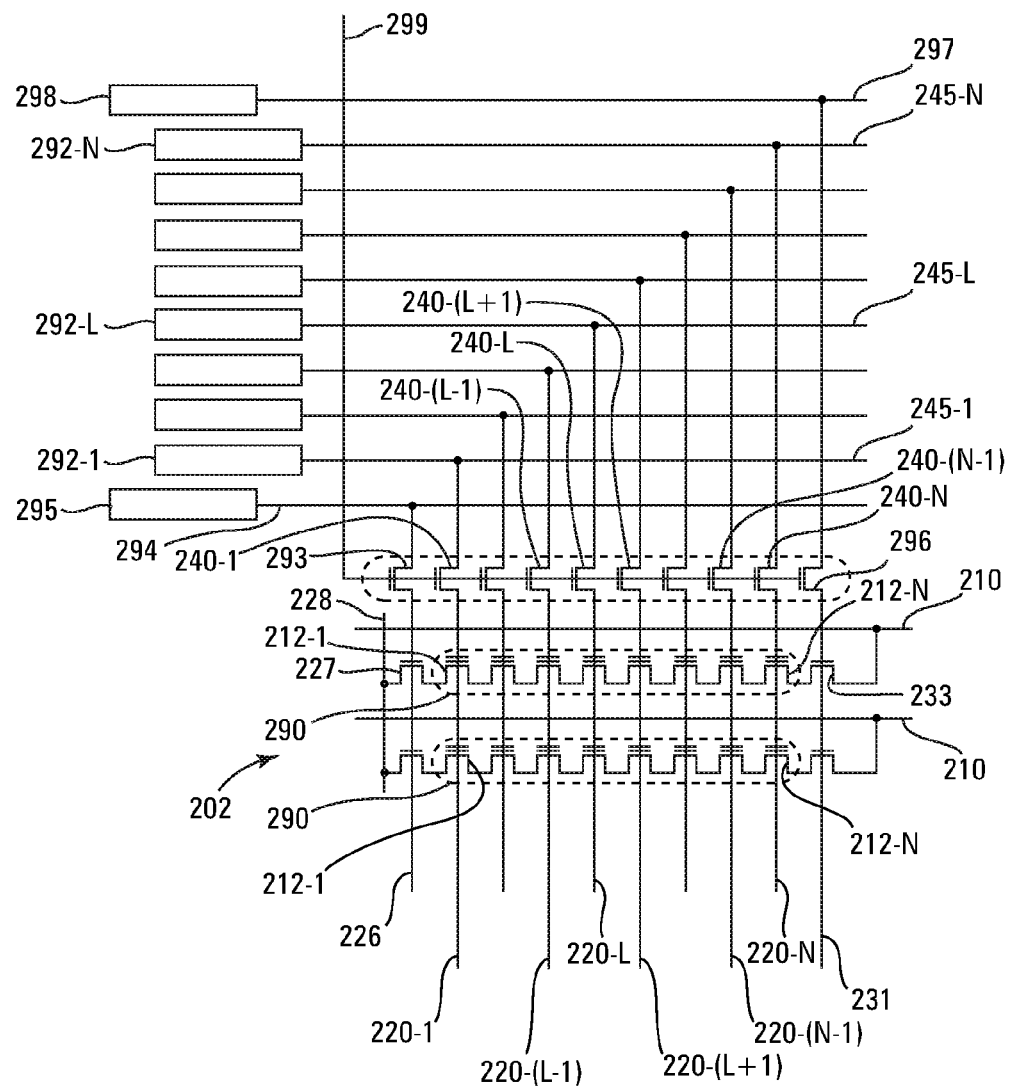
FIG. 2E is a schematic diagram of an example illustrating circuitry that includes pass transistors.

FIG. 2E is a schematic diagram of an example illustrating the coupling of pass transistors to access and select plates. For example, respective ones of the access plates 220-1 to 220-N may be respectively coupled to respective ones of the memory cells 212-1 to 212-N each of the strings 290 of memory cells 212-1 to 212-N. For example, the strings 290 may correspond to the vertical strings of memory cells 212-1 to 212-N in FIGS. 2B and 2D. Respective ones of the access plates 220-1 to 220-N may be respectively coupled to respective ones of the pass transistors 240-1 to 240-N, e.g., that include the pass transistors 240-(L+1) to 240-N in FIGS. 2A and 2B. For example, pass transistors 240-1 to 240-N may be located (e.g., only) under (e.g., directly vertically under) the staircase 234 in FIG. 2B or the staircase in FIG. 2D.

Respective ones of the steps 232-1 to 232-N respectively of the respective ones of the access plates 220-1 to 220-N in FIG. 2D may be respectively coupled to respective ones of the pass transistors 240-1 to 240-N, for example. Alternatively, respective ones of the steps 232-1 to 232-(L−1) respectively of the respective ones of access plates 220-1 to 220-(L−1) in FIG. 2B may be respectively coupled to respective ones of pass transistors 240-1 to 240-(L−1); landing 237-2 in FIG. 2B of access plate 232-L may be coupled to pass transistor 240-L; respective ones of the steps 232-(L+1) to 232-(N−1) respectively of the respective ones of the access plates 220-(L+1) to 220-(N−1) in FIG. 2B may be respectively coupled to respective ones of pass transistors 240-(L+1) to 240-(N−1); and landing 237-1 in FIG. 2B may be coupled to pass transistor 240-N.

Respective ones of the global access 245-1 to 245-N in FIG. 2E, e.g., that include the global access lines 245-(N−2) to 245-N in FIG. 2B, may be respectively coupled to respective ones of pass transistors 240-1 to 240-N. Respective ones of access-line drivers 292-1 to 292-N may be respectively coupled to respective ones of global access lines 245-1 to 245-N. A pass transistor 293 might be coupled to select plate 226 (also shown in FIG. 2D) and to a global select line 294 that is coupled to a select-line driver 295, such as a source select-line driver. A pass transistor 296 might be coupled to select plate 231 (also shown in FIG. 2D) and to a global select line 297 that is coupled to a select-line driver 298, such as a drain select-line driver. Pass transistors 293 and 296 may be located (e.g., only) under (e.g., directly vertically under) the staircase 234 in FIG. 2B or the staircase in FIG. 2D.

Control gates of pass transistors 240-1 to 240-N and pass transistors 293 and 296 might be commonly coupled to a block select line 299. Pass transistors 240-1 to 240-N and pass transistors 293 and 296 may be concurrently activated in response to the control gates of pass transistors 240-1 to 240-N and pass transistors 293 and 296 concurrently receiving a signal over block select line 299 that selects block 202. For example, respective ones of pass transistors 240-1 to 240-N may be configured to respectively selectively couple respective ones of the global access lines 245-1 to 245-N respectively to respective ones of access plates 220-1 to 220-N in response to receiving the signal over block select line 299 that selects block 202, and respective ones of pass transistors 293 and 296 may be configured to respectively selectively couple respective ones of the select plates 226 and 231 to respective ones of the global select lines 294 and 297 in response to receiving the signal over block select line 299 that selects block 202. Note that the global access lines 245-1 to 245-N and the global select lines 294 and 297 may be coupled to pass transistors for another block that are configured to couple the global access lines 245-1 to 245-N and the global select lines 294 and 297 to access plates and select plates in the other block in response to receiving another signal over another block select line that selects the other block.

Note that, in some examples, a plurality of pass transistors 240 might be coupled to each of the access plates 220-1 to 220-N. For example, a plurality of pass transistors 240-1 to a plurality of pass transistors 240-N might be respectively coupled to respective ones of the access plates 220-1 to 220-N. There might be a plurality of global access lines 245-1 to a plurality of global access lines 245-N and a plurality of different access-line drivers 292-1 to a plurality of different access-line drivers 292-1. For example, the plurality of pass transistors 240-1 to the plurality of pass transistors 240-N might be respectively coupled to the plurality of global access lines 245-1 to the plurality of global access lines 245-N that may be respectively coupled to the plurality of access-line drivers 292-1 to the plurality of access-line drivers 292-1. That is, for example, respective ones of the plurality of pass transistors 240-1 coupled to access plate 220-1 might be respectively coupled to respective ones of the plurality of global access lines 245-1 that are respectively coupled to different ones of the plurality of access-line drivers 292-1; . . . respective ones of the plurality of pass transistors 240-L coupled to access plate 220-L might be respectively coupled to respective ones of the plurality of global access lines 245-L that are respectively coupled to different ones of the plurality of access-line drivers 292-L; . . . respective ones of the plurality of pass transistors 240-N coupled to access plate 220-N might be respectively coupled to respective ones of the plurality of global access lines 245-N that are respectively coupled to different ones of the plurality of access-line drivers 292-N.

In some examples, a plurality of pass transistors 293 might be coupled to select plate 226 and a plurality of pass transistors 296 coupled to select plate 231. Respective ones of the plurality of pass transistors 293 coupled to select plate 226 might be respectively coupled to respective ones of a plurality of global select lines 294 that might be respectively coupled to respective ones of a plurality of different select-line drivers 295, and respective ones of the plurality of pass transistors 296 coupled to select plate 231 might be respectively coupled to respective ones of a plurality of global select lines 297 that might be respectively coupled to respective ones of a plurality of different select-line drivers 298.

For the example of FIG. 2D, one or more of the vertical contacts 275 might be coupled to (e.g., by direct contact with) each of the steps 232-1 to 232-N. The one or more vertical contacts 275 coupled to a respective step of each of the steps 232-1 to 232-N, for example, might be coupled to respective single pass transistor 240. For example, the one or more vertical contacts 275 coupled to step 232-1 might be coupled to a single pass transistor 240-1 (FIG. 2E); . . . the one or more vertical contacts 275 coupled to step 232-N might be coupled to a single pass transistor 240-N (FIG. 2E).

Alternatively, respective ones of the one or more vertical contacts 275 coupled to each of the steps 232-1 to 232-N might be respectively coupled to respective ones of one or more corresponding pass transistors 240. Respective ones of the one or more vertical contacts 275 coupled to a respective step of each of the steps 232-1 to 232-N, for example, might be respectively coupled to respective ones of one or more pass transistors 240 for the respective step of each of the steps 232-1 to 232-N. For example, respective ones of the one or more vertical contacts 275 coupled to step 232-1 might be respectively coupled to respective ones of one or more pass transistors 240-1; . . . respective ones of the one or more vertical contacts 275 coupled to step 232-N might be respectively coupled to respective ones of one or more of pass transistors 240-N.

One or more vertical contacts 276 in the example of FIG. 2D might be coupled to select plate 231. For example, the one or more vertical contacts 276 may be coupled to a single pass transistor 296 (FIG. 2E), or respective ones of the one or more vertical contacts 276 may be respectively coupled to respective ones of one or more pass transistors 296.

One or more vertical contacts 277 in the example of FIG. 2D might be coupled to step 244. For example, the one or more vertical contacts 277 may be coupled to a single pass transistor 293 (FIG. 2E), or respective ones of the one or more vertical contacts 277 may be respectively coupled to respective ones of one or more pass transistors 293. In some examples, one or more vertical contacts 278 in the example of FIG. 2D might be coupled to step 243.

Figure 3:
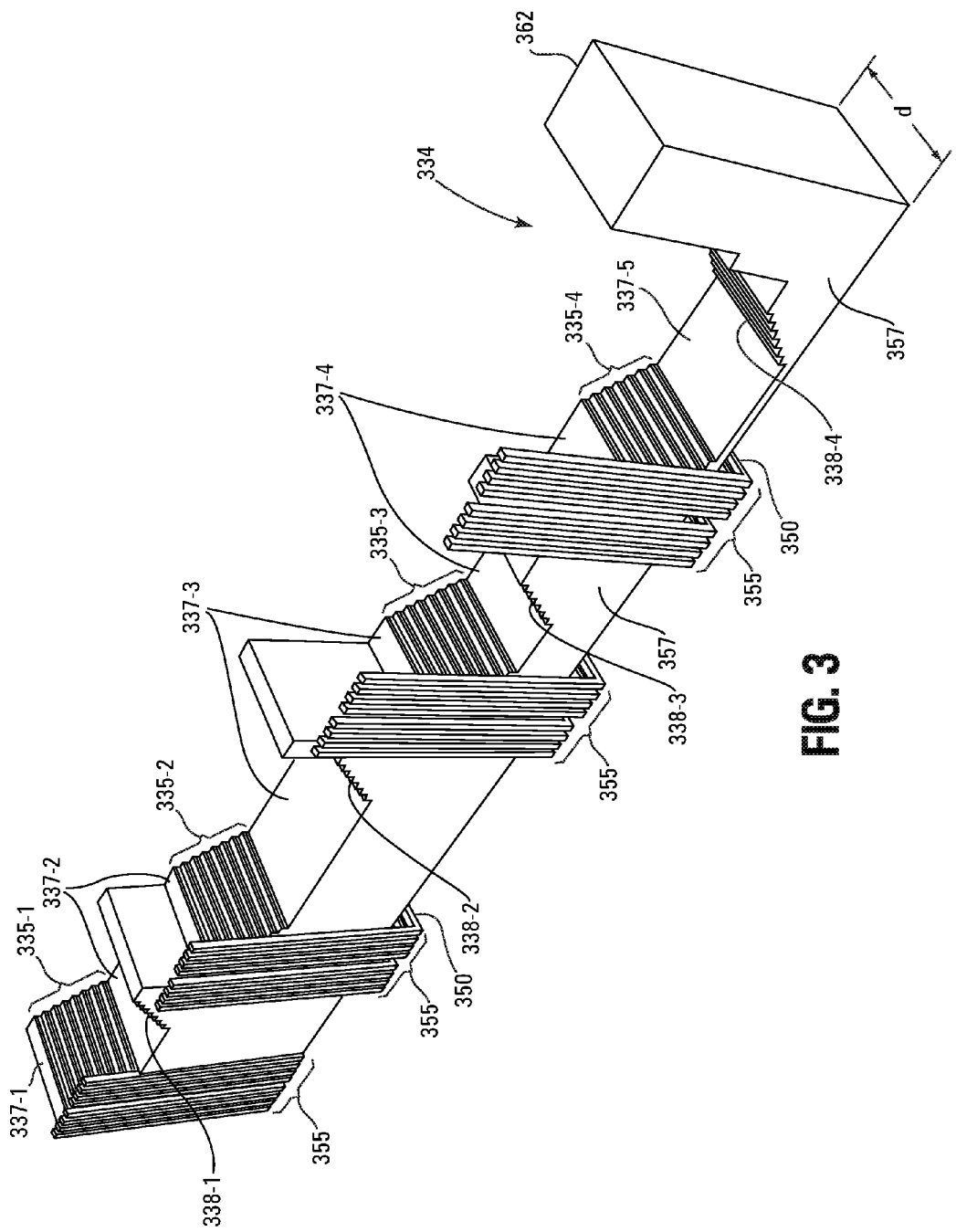
FIG. 3 is a top perspective view of an example of a staircase of a memory device that includes a stacked memory array.

FIG. 3 is a top perspective view of an example staircase 334 that may extend in a direction perpendicular to the data lines of a memory array away from a memory block of memory cells of the memory array, e.g., in a manner similar to (e.g., the same as) described above for staircase 234 in conjunction with FIGS. 2A and 2B. For example, the staircase 334 may include a plurality of groups (e.g., flights) 335 of steps (e.g., stairs), such as groups 335-1 to 335-4, e.g., in tandem. For example, groups 335-1, 335-2, 335-3, and 335-4 may respectively be consecutive groups in the direction away from the memory block.

For example, the memory block 202-2 in FIG. 2A may be located at the outside of the landing 337-1 in FIG. 3. The steps 232-(L+1) to 232-(N-1) in FIG. 2A might correspond to the steps of group 335-1 in FIG. 3. The landing 237-2 in FIG. 2A may correspond to the landing 337-2 in FIG. 3. The steps 232-1 to 232 (L-1) in FIG. 2A correspond to the steps of group 335-2 in FIG. 3.

Arranging the groups of steps in tandem in a direction away from a memory array, as in FIGS. 2A and 3, for example, allows groups of steps to be added without increasing a distance d from a sidewall 357 to an opposing sidewall 362 of staircase 334, e.g., in a direction parallel to the data lines of the memory block, such as the data lines 210 in FIG. 2A.

Sidewalls 357 and 362 may be parallel and may extend from the memory block in a direction perpendicular to data lines, such as data lines 210 in FIG. 2A, e.g., in a manner similar to (e.g., the same as) for sidewalls 257 and 262 of staircase 234, as described above in conjunction with FIG. 2A. In some examples, the distance d might be less than or equal to the block pitch, such as the block pitch P2 in FIG. 2A. Therefore, groups of steps may be added without increasing the block pitch, for example.

A step, for example, may be a portion of an access plate that extends beyond an end of the access plate at the next higher vertical level (e.g., the next higher access plate). A landing 337 may extend beyond a lowermost step of a group steps and may terminate above the next consecutive group of steps, in the direction away from the memory block, so that an uppermost step of the next consecutive group of steps is below and extends beyond the landing 337. For example, landing 337-2 may extend beyond the lowermost step of group 335-1 and may terminate above the uppermost step of group 335-2 so that the uppermost step of group 335-2 extends beyond landing 337-2; landing 337-3 may extend beyond the lowermost step of group 335-2 and may terminate above the uppermost step of group 335-3 so that the uppermost step of group 335-3 extends beyond landing 337-3; etc. Landing 337-1, for example, may be a portion of an access plate that is commonly coupled to an uppermost tier of memory cells and may terminate above the uppermost step of group 335-1 so that the uppermost step of group 335-1 extends beyond landing 337-1.

Groups 338-1 to 338-4 of dummy steps might be respectively mirror images of the groups 335-1 to 335-4, and groups 338-1 to 338-4 of dummy steps might be respectively formed while the groups 335-1 to 335-4 are formed. For example, groups 335-1 and 338-1 might be mirror images of each other; groups 335-2 and 338-2 might be mirror images of each other; etc. For example, the dummy steps might not be electrically coupled to a tier of memory cells.

A group of dummy steps might be between consecutive groups of steps. For example, group 338-1 might be between the consecutive groups 335-1 and 335-2; group 338-2 might be between the consecutive groups 335-2 and 335-3; etc.

A landing 337 may pass under a group of dummy steps. For example, a landing 337 that might extend beyond a lowermost step of a group of steps 335 and that might terminate above the next consecutive group 335 of steps, in the direction away from the memory block, might pass under the group of dummy steps between those consecutive groups 335 of steps. For example, landing 337-2 might extend under the group 338-1; landing 337-3 might extend under the group 338-2; etc.

The example of FIG. 3 shows that vertical contacts 355 may be adjacent to and outside of sidewall 357 of staircase 334. Vertical contacts 355 may be coupled to (e.g., by direct contact with) lines 350 that might extend under staircase 334 and might be respectively coupled to pass transistors under staircase 334. Vertical contacts 355 may be may be distributed (e.g., aligned) along a direction that is perpendicular to the data lines, such as data lines 210 in FIG. 2A. For example, vertical contacts 355 may be distributed along the length of sidewall 357 in a direction parallel to sidewall 357, and thus in a direction perpendicular to the data lines. That is, for example, vertical contacts 355 may be aligned with a line that is perpendicular to the data lines. For example, contacts 355 may be distributed (e.g., aligned) along a direction that is parallel to the direction which the steps and/or landings extend beyond steps and/or landings above them.

Respective ones of the vertical contacts 355 may be respectively coupled to respective ones of the steps of the groups 335-1 to 335-4 and respective ones of the landings 337-1 to 337-5. For example, the vertical contacts 355 may be coupled to lines (not shown in FIG. 3), e.g., that are at the level of the data lines, that are in turn coupled to the steps and landings by vertical contacts (not shown in FIG. 3) that extend vertically downward from the lines to (e.g. into direct contact with) the steps and landings.

Figure 4:
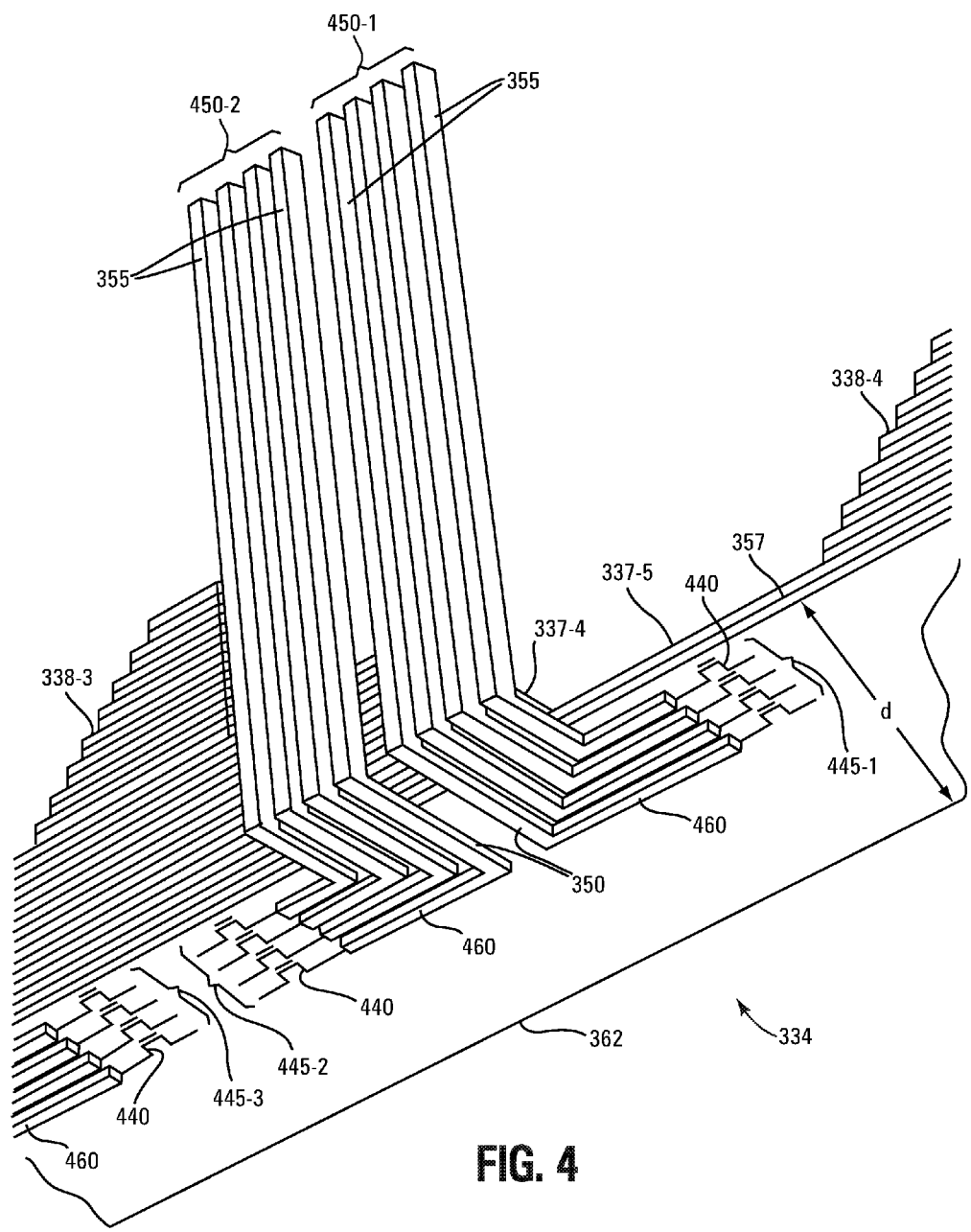
FIG. 4 is a bottom perspective view of an example of a portion of a staircase of a memory device.

FIG. 4 is a bottom perspective view of a portion of the staircase 334. In the example of FIG. 4, groups of the vertical contacts 355 might be coupled to groups of pass transistors 440. For example, the pass transistors 440 of groups 445-1 and 445-2 might be respectively coupled to the vertical contacts 355 of groups 450-1 and 450-2. The pass transistors 440 might span the distance d (e.g., in a direction parallel to data lines, such as the data lines 210 in FIG. 2A) from the sidewall 357 of staircase 334 to the sidewall 362 of staircase 334.

Group 445-1 of pass transistors 440 might be located directly vertically under a landing, such as landing 337-5. Group 445-2 of pass transistors 440 might be located directly vertically under a group of dummy steps, such as the group 338-3 of dummy steps.

Respective ones of the pass transistors 440 in a group 445 might be respectively coupled to respective ones of the vertical contacts 355 in a group 450. For example, respective ones of the pass transistors 440 in group 445-1 might be respectively coupled to respective ones of the vertical contacts 355 in group 450-1, and respective ones of the pass transistors 440 in group 445-2 might be respectively coupled to respective ones of the vertical contacts 355 in group 450-2. For example, the number of vertical contacts 355 in a group 450 might be equal to the number of pass transistors 440 in a group 445.

In some examples, the number of pass transistors 440 in a group might be limited to the number of pass transistors 440 that can be fit into the distance d, e.g., and thus ultimately by the block pitch. However, this does not limit the number of pass transistors, in that there can be multiple groups of pass transistors 440, such as the groups 445-1 to 445-3 in the example of FIG. 4. For example, the groups 445-1 to 445-3 may be respectively at different locations distributed along the length of staircase 334 in a direction parallel to sidewalls 357 and 362, and thus in a direction perpendicular to the data lines and the block pitch, where the pass transistors in each of the groups 445-1 to 445-3 may be aligned along a direction that perpendicular to sidewalls 357 and 362, and thus in a direction parallel to the data lines. For example, the groups 445-1 to 445-3 may be respectively at different locations along a direction that is parallel to the direction which the steps and/or landings extend beyond steps and/or landings above them. Therefore, the number of pass transistors 440 and the number of contacts 355 can be increased by increasing the length of staircase 334 without increasing the distance d or the block pitch.

A pass transistor 440 might be coupled to (e.g., by direct contact with) a line 460 that may be under (e.g., directly vertically under) staircase 334 and may be parallel to sidewalls 357 and 362, as shown in FIG. 4. A line 460 may be coupled to (e.g., by direct contact with) a line 350 that may be perpendicular to the line 460 and that may extend past and outside of sidewall 357 and be coupled to (e.g., by direct contact with) a vertical contact 355.

In some examples, the number of pass transistors that can fit in the distance d might be fewer than the number of steps in a group of steps. Therefore, different portions of the steps in a group of steps may be coupled to different groups of pass transistors that may be at different locations distributed along the length of staircase 334, e.g., in a direction perpendicular to the data lines and parallel to the direction that the steps and/or landings extend beyond steps and/or landings above them.

Respective ones of the pass transistors in group 445-1 might be respectively coupled to respective ones of the vertical contacts 355 of group 450-1 that may be respectively coupled to respective ones of a portion of the steps in group 335-4, and respective ones of the pass transistors in group 445-2 might be respectively coupled to respective ones of the vertical contacts 355 of group 450-2 that may be respectively coupled to respective ones of a remaining portion of the steps in group 335-4. Alternatively, for example, respective ones of the pass transistors in group 445-1 might be respectively coupled to respective ones of the vertical contacts 355 of group 450-1 that may be respectively coupled to landing 337-5 and a portion of the steps in group 335-4, and respective ones of the pass transistors in group 445-2 might be respectively coupled to respective ones of the vertical contacts 355 of group 450-2 that may be respectively coupled to respective ones of landing 337-4 and a remaining portion of the steps in group 335-4.

Figure 5:
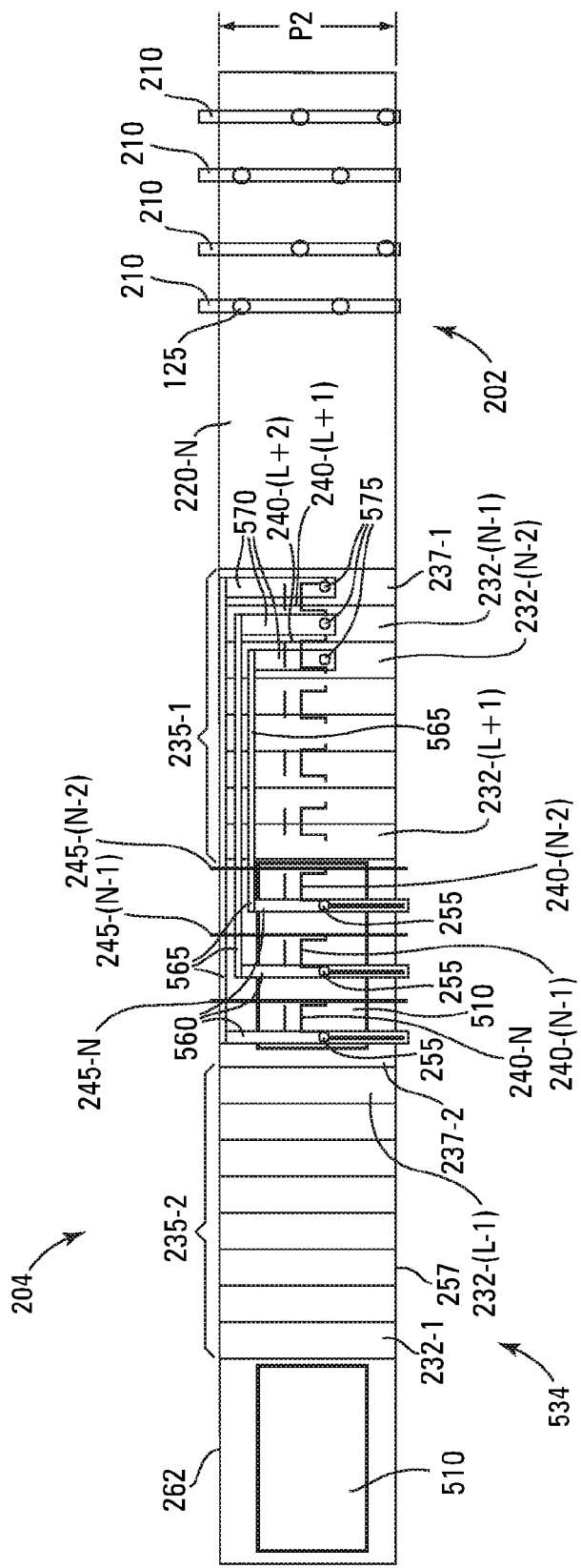
FIG. 5 is a top-down view of another example of a portion of a staircase of a memory device that includes a stacked memory array.

FIG. 5 is a top-down view of an example of a portion of a memory device that includes a memory block 202, such as described above in conjunction with FIGS. 2A and 2B. Common numbering is used in FIG. 5 and FIGS. 2A and 2B to denote similar (e.g., the same components) in FIG. 5 and FIGS. 2A and 2B, e.g., such commonly numbered components may be as described above in conjunction with FIGS. 2A and 2B.

In the example of FIG. 5, a dielectric 510 may be in a landing, such as in landing 237-2, e.g., between the sidewalls 257 and 262. For example, an upper surface of dielectric 510 might be at the level (e.g., flush with) the upper surface of landing 237-2, and a bottom surface of dielectric 510, might be flush with (e.g., might form a portion of) a bottom surface of staircase 534. Dielectric 510 may be generally formed of one or more dielectric materials, such as oxide and/or nitride. The oxide and nitride might be stacked and might alternate in some examples.

The vertical contacts 255 may extend vertically through the dielectric 510, and thus through the landings, such as landing 237-2, from respective ones of the pass transistors 240-(N−2) to 240-N respectively to respective ones of lines 560, e.g., that might be at the vertical level of data lines 210. The respective ones of vertical contacts 255 may be respectively coupled to (e.g., by direct contact with) respective ones of the lines 560. Respective ones of lines 560 may extend over landing 237-2 (e.g., in a direction parallel to data lines 210) respectively from the respective ones of vertical contacts 255 respectively to respective ones of lines 565. The respective ones of lines 560 may be respectively coupled to (e.g., by direct contact with) the respective ones of lines 565. Lines 565, for example, might be at the vertical level of data lines 210 and might pass over landing 237-2 and at least a portion of the group 235-1 of steps, e.g., in a direction perpendicular to data lines 210.

The respective ones of lines 565 may respectively extend, e.g., in a direction perpendicular to data lines 210, respectively from the respective ones of lines 560 respectively to respective ones of lines 570. The respective ones of lines 565 may be respectively coupled to (e.g., by direct contact with) the respective ones of lines 570, e.g., that may be at the vertical level of data lines 210.

The respective ones of lines 570 may respectively extend over respective ones of step 232-(N−2), step 232-(N−1), and landing 237-1 (e.g., in a direction parallel to data lines 210) respectively from the respective ones of lines 565 respectively to respective ones of vertical contacts 575. The respective ones of lines 570 may be respectively coupled to (e.g., by direct contact with) the respective ones of vertical contacts 575. The respective ones of the vertical contacts 575 may respectively extend vertically downward from the respective ones of lines 570 respectively to the respective ones of step 232-(N−2), step 232-(N−1), and landing 237-1. The respective ones of the vertical contacts 575 may be respectively coupled to (e.g., by direct contact with) the respective ones of step 232-(N−2), step 232-(N−1), and landing 237-1.

In the example of FIG. 5, the line 565 coupled to landing 237-1 may extend over the steps between landing 237-1 and landing 237-2 to a respective line 570; the line 565 coupled to step 232-(N−1) may extend over the steps between landing 237-2 and step 232-(N−1) to a respective line 570; and the line 565 coupled to step 232-(N−2) may extend over the steps between landing 237-2 and step 232-(N−2) to a respective line 570.

Figure 6:
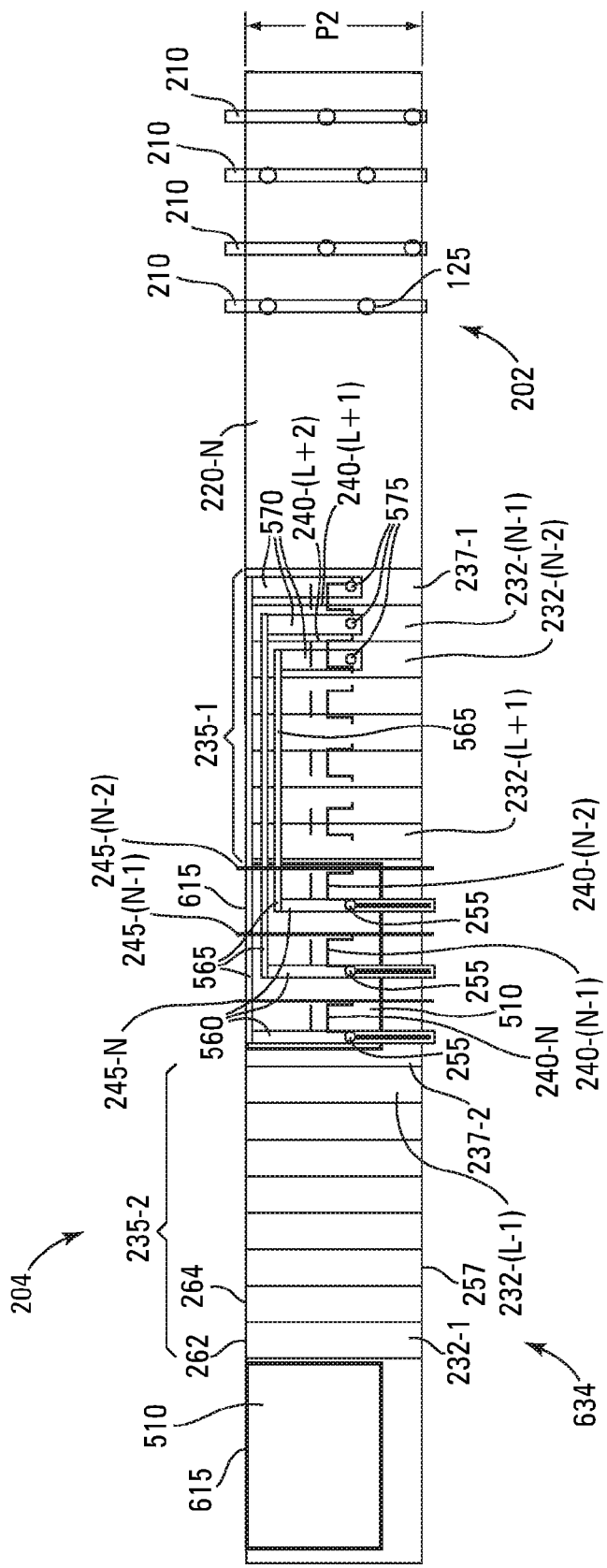
FIG. 6 is a top-down view of another example of a staircase of a memory device that includes a stacked memory array.

FIG. 6 is a top-down view of an example of a portion of a memory device that includes a memory block 202, such as described above in conjunction with FIGS. 2A and 2B. Common numbering is used in FIGS. 2A, 2B, 5, and 6 to denote similar (e.g., the same components) in FIGS. 2A, 2B, 5, and 6. For example, such commonly numbered components may be as described above in conjunction with FIGS. 2A, 2B, and 5. For example, staircase 634 in FIG. 6 might be as described for the staircase 534 in FIG. 5, but for a difference between the location of dielectric 510 in staircase 634 and the location of dielectric 510 in staircase 534.

In staircase 634, for example, dielectric 510 might extend to the sidewall 262 of staircase 634. That is, for example, an outside surface 615 of a sidewall of dielectric 510 might be flush with an outside surface 264 of sidewall 262. Dielectric 510 might form a portion of sidewall 262, for example.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
    a staircase comprising a flight of stairs, wherein stairs of the flight of stairs are respectively coupled to different tiers of memory cells;
    a plurality of pass transistors directly under the staircase; and
    wherein a different pass transistor of the plurality of pass transistors is coupled to each of the stairs of the flight of stairs; and
    wherein the flight of stairs is between a first landing coupled to a tier of memory cells that is below the different tiers of memory cells to which the stairs of the flight of stairs are respectively coupled and a second landing coupled to a tier of memory cells that is above the different tiers of memory cells to which the stairs of the flight of stairs are respectively coupled.

2. The memory device of claim 1, wherein the pass transistors of the plurality of pass transistors are aligned along a direction that a first stair in the flight of stairs extends beyond a second stair in the flight of stairs that is above the first stair.

3. The memory device of claim 1, wherein a first portion of the plurality of pass transistors and a second portion of the plurality of pass transistors are respectively at different locations distributed along a direction that a first stair in the flight of stairs extends beyond a second stair in the flight of stairs that is above the first stair.

4. The memory device of claim 3, wherein a different pass transistor of the plurality of pass transistors being coupled to each of the stairs of the flight of stairs comprises a different pass transistor of the first portion of the plurality of pass transistors being coupled to each vertical contact of a first group of vertical contacts, a different vertical contact of the first group of vertical contacts coupled to each stair of a first group of the stairs of the flight of stairs, and a different pass transistor of the second portion of the plurality of pass transistors being coupled to each vertical contact of a second group of vertical contacts, a different vertical contact of the second group of vertical contacts coupled to each stair of a second group of the stairs of the flight of stairs.

5. The memory device of claim 4, wherein the first group of vertical contacts and the second group of vertical contacts are distributed along a direction that the first stair in the flight of stairs extends beyond the second stair in the flight of stairs that is above the first stair.

6. The memory device of claim 1, wherein a respective pass transistor of the plurality of pass transistors is coupled to a respective stair in the flight of stairs by a first vertical contact that is coupled to the respective pass transistor and that is coupled to a line that is above the staircase, wherein the line is coupled to one or more second vertical contacts that are between the line and the respective stair in the flight of stairs and that are coupled to the respective stair in the flight of stairs.

7. The memory device of claim 1, wherein a different pass transistor of the plurality of pass transistors being coupled to each of the stairs of the flight of stairs comprises one or more pass transistors of the plurality pass transistors being coupled to each of the stairs of the flight of stairs.

8. The memory device of claim 7, wherein the one or more pass transistors of the plurality pass transistors being coupled to each of the stairs of the flight of stairs comprises respective ones of the one or more pass transistors that are coupled to a respective stair of the flight of stairs being respectively coupled to respective ones of a plurality of global access lines or the one or more pass transistors that are coupled to the respective stair of the flight of stairs being coupled to a single global access line.

9. A memory device, comprising:
a staircase comprising a flight of stairs, wherein stairs of the flight of stairs are respectively coupled to different tiers of memory cells;
a plurality of pass transistors directly under the staircase; and
wherein a different pass transistor of the plurality of pass transistors is coupled to each of the stairs of the flight of stairs; and
wherein a pass transistor of the plurality of pass transistors is coupled to a respective stair of the flight of stairs by a vertical contact that passes through a landing, wherein the landing is coupled to a tier of memory cells other than the different tiers of memory cells to which the stairs of the flight of stairs are respectively coupled.

10. The memory device of claim 9, wherein the landing is below the flight of stairs and the tier of memory cells to which the landing is coupled is below the different tiers of memory cells to which the stairs of the flight of stairs are respectively coupled.

11. The memory device of claim 9, wherein the landing is coupled to another pass transistor that is under the staircase.

12. The memory device of claim 9, wherein a pass transistor of the plurality of pass transistors that is coupled to a stair of the flight of stairs is directly vertically under the landing.

13. The memory device of claim 9, wherein the vertical contact that passes through the landing passes through a dielectric selected from the group consisting of the dielectric being between sidewalls of the staircase and the dielectric forming a portion of a sidewall of the staircase.

14. The memory device of claim 1, wherein the plurality of pass transistors comprise a plurality of first pass transistors, and further comprising a second pass transistor directly under the first landing and coupled to a vertical contact that passes through the first landing and that is coupled to the second landing.

15. The memory device of claim 1, wherein the pass transistors of the plurality of pass transistors are configured to selectively couple the stairs of the flight of stairs to which the pass transistors of the plurality of pass transistors are coupled to global access lines.

16. The memory device of claim 1, wherein the stairs of the flight of stairs are respectively portions of access plates that are respectively coupled to the different tiers of memory cells.

17. A memory device, comprising:
a data line selectively coupled to a string of memory cells comprising a memory cell in a first tier of memory cells and a memory cell in a second tier of memory cells;
a staircase comprising a first flight comprising a first step at a first level coupled to the first tier of memory cells and a second flight comprising a second step at a second level coupled to the second tier of memory cells;
a first pass transistor under the staircase and coupled to a first vertical contact that is coupled to the first step;
a second pass transistor under the staircase and coupled to a second vertical contact that is coupled to the second step;
a landing between the first and second flights and coupled to a third tier of memory cells and coupled to a third pass transistor that is under the staircase;
wherein the first and second vertical contacts are distributed along a direction that is perpendicular to the data line.

18. The memory device of claim 17, wherein the first and second vertical contacts are outside of sidewalls of the staircase that are perpendicular to the data line.

19. The memory device of claim 17, wherein the first and second vertical contacts being distributed along the direction that is perpendicular to the data line comprises the first and second vertical contacts being distributed along a sidewall of the staircase that is perpendicular to the data line.

20. The memory device of claim 17, wherein the landing being coupled to the third pass transistor comprises the landing being coupled to a third vertical contact that is coupled to the third pass transistor, wherein the third vertical contact is aligned with the first and second vertical contacts along the direction that is perpendicular to the data line.

21. The memory device of claim 20, wherein the landing passes under a flight of dummy steps between the first and second flights.

22. The memory device of claim 17, wherein the first and second tiers are respectively at the first and second levels.

23. A memory device, comprising:
a staircase, comprising:
a first group of steps, the steps of the first group of steps respectively coupled to tiers of memory cells that are respectively at different vertical levels;
a landing above the first group of steps and coupled to a tier of memory cells that is above the tiers of memory cells coupled to the first group of steps; and
a second group of steps above the landing, the steps of the second group of steps respectively coupled to tiers of memory cells that are respectively at different vertical levels above the tier of memory cells coupled to the landing;
a plurality of vertical contacts distributed along a direction that the landing extends beyond the steps of the second group of steps; and
a plurality of pass transistors under staircase;
wherein the vertical contacts of the plurality of vertical contacts are respectively coupled to the steps in the first and second groups of steps and the landing, and are respectively coupled to the pass transistors of the plurality of pass transistors.

24. The memory device of claim 23, wherein the first group of steps has a different number of steps than the second group of steps.

25. The memory device of claim 23, wherein a pass transistor of the plurality of pass transistors that is coupled to a vertical contact coupled to a step in the second group of steps is directly under the landing.

26. The memory device of claim 23, wherein the landing is a first landing, the plurality of pass transistors are a plurality of first pass transistors, and further comprising:
- a second landing above the second group of steps and coupled to a tier of memory cells above the tiers of memory cells coupled to the second group of steps; and
- a second pass transistor directly under the first landing that is coupled to the second landing.

\* \* \* \* \*

UNITED STATES PATENT AND TRADEMARK OFFICE
CERTIFICATE OF CORRECTION

| | | |
|---|---|---|
| PATENT NO. | : 9,589,978 B1 | |
| APPLICATION NO. | : 15/053291 | |
| DATED | : March 7, 2017 | |
| INVENTOR(S) | : Aaron S. Yip | |

It is certified that error appears in the above-identified patent and that said Letters Patent is hereby corrected as shown below:

In the Claims

Column 22, Line 18, delete "step;" and insert in place thereof --Step; and--.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*